United States Patent
Ono et al.

(10) Patent No.: US 9,960,016 B2
(45) Date of Patent: May 1, 2018

(54) PLASMA PROCESSING METHOD

(71) Applicant: Tokyo Electron Limited, Tokyo (JP)

(72) Inventors: Kumiko Ono, Miyagi (JP); Hiroshi Tsujimoto, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/464,503

(22) Filed: Mar. 21, 2017

(65) Prior Publication Data

US 2017/0278675 A1    Sep. 28, 2017

(30) Foreign Application Priority Data

Mar. 22, 2016   (JP) .................. 2016-057010

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01J 37/32* | (2006.01) |

(52) U.S. Cl.
CPC .. *H01J 37/32174* (2013.01); *H01J 37/32091* (2013.01); *H01J 37/32165* (2013.01); *H01J 37/32183* (2013.01); *H01J 37/32449* (2013.01); *H01J 37/32577* (2013.01)

(58) Field of Classification Search
USPC ........................................... 216/67
See application file for complete search history.

(56) References Cited

U.S. PATENT DOCUMENTS

2016/0163554 A1* 6/2016 Funakubo ......... H01J 37/32146
                                                            438/714

FOREIGN PATENT DOCUMENTS

JP    2013-058749 A    3/2013

\* cited by examiner

*Primary Examiner* — Roberts Culbert
(74) *Attorney, Agent, or Firm* — Pearne & Gordon LLP

(57) ABSTRACT

In a plasma processing method in which multiple cycles, each of which includes a first stage of generating plasma of a first processing gas containing a first gas and a second stage of generating plasma of a second processing gas containing the first gas and a second gas, are performed, a time difference between a start time point of a time period during which the second stage is performed and a start time point of an output of the second gas from a gas supply system is decided automatically according to a recipe. A delay time corresponding to flow rates of the first gas and the second gas in the second stage is specified from a function or a table. The output of the second gas is begun prior to the start time point of the second stage by a time difference set based on the delay time.

5 Claims, 16 Drawing Sheets

PLASMA PROCESSING METHOD

CROSS-REFERENCE TO RELATED APPLICATION

This application claims the benefit of Japanese Patent Application No. 2016-057010 filed on Mar. 22, 2016, the entire disclosures of which are incorporated herein by reference.

TECHNICAL FIELD

The embodiments described herein pertain generally to a plasma processing method performed by a plasma processing apparatus for processing a processing target object.

BACKGROUND

In the manufacture of an electronic device such as a semiconductor device, a plasma processing is performed on a processing target object by using a plasma processing apparatus. In general, the plasma processing apparatus includes a processing vessel, a gas supply system, a first electrode, a second electrode, a first high frequency power supply and a second high frequency power supply. The gas supply system is configured to supply a gas into the processing vessel. The first electrode and the second electrode are disposed with a space within the processing vessel therebetween. The first high frequency power supply is configured to supply a first high frequency power for plasma generation to either one of the first electrode and the second electrode, and the second high frequency power supply is configured to supply a second high frequency power for ion attraction, which has a relatively low frequency, to the second electrode. Generally, in the plasma processing performed in this plasma processing apparatus, the gas is supplied into the processing vessel from the gas supply system, and the first high frequency power from the first high frequency power supply is supplied to either one of the first electrode and the second electrode to generate plasma. The second high frequency power from the second high frequency power supply is supplied to the second electrode, when necessary.

In the plasma processing, a first stage of generating plasma of a first processing gas and a second stage of generating plasma of a second processing gas may be performed alternately. That is, a multiple number of cycles each of which includes the first stage and the second stage may be performed. The first processing gas includes a first gas, and the second processing gas includes the first gas and a second gas added to the first gas. In this plasma processing, the first gas is supplied into the processing vessel over a first period during which the first stage is performed and a second period during which the second stage is performed. Furthermore, the first high frequency power is supplied to either one of the first electrode and the second electrode over the first period and the second period. Further, in the second stage, the second high frequency power is supplied to the second electrode. The supply of the second high frequency power in the second stage is started from the start time point of the second stage. In addition, in the first stage, a supply of the second high frequency power to the second electrode may not be performed, or a second high frequency power having a power lower than that of the second high frequency power supplied in the second stage may be supplied to the second electrode.

Since a gas has a mass, there is required a time period from the time point when the gas supply system starts the supply of the second gas to the time point when the second gas actually reaches the processing vessel. Meanwhile, the second high frequency power is supplied to the second electrode nearly without being delayed at the time point when the supply of the high frequency power from the second high frequency power supply is begun. Accordingly, it happens that the second high frequency power is supplied to the second electrode at a time point when the second gas has not reached the processing vessel yet. To prevent this problem, it is required to reduce a time difference between the time point when the second gas is supplied into the processing vessel and the time point when the second high frequency power is supplied to the second electrode.

Further, there is required a time period from the time point when the output of the second gas from the gas supply system is stopped to the time point when the supply of the second gas into the processing vessel is stopped. Meanwhile, the supply of the second high frequency power to the second electrode is ended nearly without being delayed at the time point when the output of the second high frequency power from the second high frequency power supply is stopped. Accordingly, it happens that the supply of the second high frequency power is ended though the second gas is still being supplied into the processing vessel. To prevent this problem, it is required to reduce a time difference between the time point when the supply of the second gas into the processing vessel is stopped and the time point when the supply of the second high frequency power is stopped.

Further, Patent Document 1 discloses a technique of detecting a time point when the gas has reached the processing vessel by using emission spectrum of plasma within the processing vessel and beginning the supply of the high frequency power at this time point.

Patent Document 1: Japanese Patent Laid-open Publication No. 2013-058749

As a way to solve the aforementioned problems, it may be considered to start the output of the second gas from the gas supply system at a time point prior to a start time point of the supply of the second high frequency power, i.e., prior to a start time point of the second period. Further, it may be considered to stop the output of the second gas from the gas supply system at a time point prior to an end time point of the supply of the second high frequency power, i.e., prior to an end time point of the second period. In these methods, a time difference between the start time point of the second period and the start time point of the output of the second gas from the gas supply system needs to be decided. Further, it is also required to decide a time difference between the end time point of the second period and the end time point of the output of the second gas from the gas supply system. Moreover, these time differences need to be automatically decided according to a recipe.

SUMMARY

In one exemplary embodiment, there is provided a plasma processing method performed by a plasma processing apparatus. The plasma processing apparatus includes a processing vessel, a gas supply system, a first electrode, a second electrode, a first high frequency power supply, a second high frequency power supply and a controller. The gas supply system is configured to supply a gas into the processing vessel. The first electrode and the second electrode are arranged with a space within the processing vessel therebetween. The first high frequency power supply is configured to output a first high frequency power for plasma generation which is supplied to either one of the first electrode and the second electrode. The second high frequency power supply is configured to supply a second high frequency power for ion attraction which is supplied to the second electrode. The controller is configured to control the gas supply system, the first high frequency power supply and the second high frequency power supply.

In the plasma processing method, multiple cycles, each of which includes a first stage and a second stage, are performed. In the first stage, plasma of a first processing gas containing a first gas is generated within the processing vessel. In the second stage which follows the first stage, plasma of a second processing gas containing the first gas and a second gas added to the first gas is generated within the processing vessel. In each cycle, the first gas is supplied into the processing vessel and the first high frequency power is supplied to the either one of the first electrode and the second electrode over a first period during which the first stage is performed and a second period during which the second stage is performed after the first period. In the second period of each cycle, the second high frequency power is supplied to the second electrode. In the first period of each cycle, a power level of the second high frequency power is set to be lower than a power level of the second high frequency power in the second period. For example, the second high frequency power may not be supplied to the second electrode in the first period.

In this plasma processing method includes (i) starting an output of the second gas from the gas supply system at an output start time point which precedes a start time point of the second period by a first time difference under the control of the controller; (ii) starting a supply of the second high frequency power to the second electrode at the start time point of the second period under the control of the controller; (iii) stopping the output of the second gas from the gas supply system at an output stop time point, within the second period, which precedes an end time point of the second period by a second time difference under the control of the controller; and (iv) reducing the power level of the second high frequency power at the end time point of the second period under the control of the controller. The controller specifies, by using a function or a table, a first delay time related to a flow rate of the first gas and a flow rate of the second gas in the second stage designated in a recipe, and sets the first delay time as the first time difference initially. Here, the function or the table relates the flow rate of the first gas and the flow rate of the second gas to a delay time from a time point when the gas supply system starts the output of the second gas to a time point when the second gas is supplied into the processing vessel. Further, the controller specifies, by using a function or a table which relates the flow rate of the first gas to a delay time from a time point when the gas supply system stops the output of the second gas to a time point when the supply of the second gas into the processing vessel is ended, a second delay time related to the flow rate of the first gas in the second stage designated in the recipe, and sets the second delay time as the second time difference initially.

The delay time between the time point when the gas supply system starts the output of the second gas contained in the second processing gas and the time point when the second gas reaches the processing vessel depends on the flow rates of the first gas and the second gas in the second stage, that is, the flow rate of the first gas and the flow rate of the second gas contained in the second processing gas. In the plasma processing method, the function or the table is previously created. The function or the table relates the flow rates of the first gas and the second gas to the delay time between the time point when the gas supply system starts the output of the second gas contained in the second processing gas and the time point when the second gas reaches the processing vessel. By using the corresponding function or table, the controller specifies the first delay time corresponding to the flow rates of the first gas and the second gas in the second stage which are designated in the recipe, and sets this first delay time as the first time difference initially. The first time difference is used to decide the output start time point of starting the output of the second gas with respect to the time point of starting the supply of the second high frequency power. As stated above, in the plasma processing method, the time difference which decides the output start time point of starting the output of the second gas with respect to the time point of starting the supply of the second high frequency power can be decided automatically according to the recipe. Further, according to the plasma processing method, the time difference between the time point when the second gas is supplied into the processing vessel and the time point when the second high frequency power is supplied to the second electrode is reduced.

Furthermore, though the time point when the supply of the second gas into the processing vessel is ended is delayed with respect to the time point when the gas supply system stops the output of the second gas, it is desirable that the time difference between the end time point of the second stage and the time point when the supply of the second gas into the processing vessel is ended is small. Here, the delay time between the time point when the supply of the second gas into the processing vessel is ended and the time point when the gas supply system stops the output of the second gas depends on the flow rate of the first gas in the second stage. In the exemplary embodiment, by using the function or table, the controller specifies the second delay time corresponding to the flow rate of the first gas designated in the recipe, and sets this second delay time as the second time difference initially. The second time difference is used to decide the output stop time point of stopping the output of the second gas with respect to the end time point of the second stage. As stated above, the time difference which decides the output stop time point of stopping the output of the second gas with respect to the end time point of the second stage can be decided automatically according to the recipe. Further, the time difference between the time point when the supply of the second gas into the processing vessel is ended and the end time point of the second stage can be reduced.

The plasma processing apparatus further includes a first power feed line, a second power feed line, a first matching device, a second matching device and an operation unit. The first power feed line is configured to connect the either one of the first electrode and the second electrode to the first high frequency power supply. The second power feed line is configured to connect the second electrode to the second high frequency power supply. The first matching device is configured to adjust a load impedance of the first high frequency power supply. The second matching device is configured to adjust a load impedance of the second high frequency power supply. The operation unit is configured to calculate a parameter which includes at least one of the load impedance, a load resistance and a load reactance of the first high frequency power supply and a reflection wave coefficient of the first high frequency power.

In the plasma processing method, if the parameter exceeding a first threshold value is obtained by the operation unit during a time period between the output start time point immediately before the second period within a processing time of a preset cycle among the cycles and the start time point of the second period within the processing time of the preset cycle, the controller decreases the first time difference by a time difference between a time point when the parameter exceeding the first threshold value is obtained and the start time point of the second period within the processing time of the preset cycle.

If the second gas is supplied into the processing vessel, the impedance of the plasma is changed, so that the parameter is increased. In the present exemplary embodiment, the time point when this parameter exceeds the first threshold value is used as the time point when the second gas is supplied into the processing vessel. Further, if the time point when the parameter exceeds the first threshold value precedes the start time point of the second period, it is determined that the second gas is supplied into the processing vessel before the start time point of the second period. Thus, the first time difference is adjusted in order to delay the output start time point of the next cycle. Accordingly, the time difference between the time point when the second gas is supplied into the processing vessel and the time point when the second high frequency power is supplied to the second electrode is reduced.

In the plasma processing method, if the parameter exceeding the first threshold value is not obtained by the operation unit during the time period between the output start time point immediately before the second period within the processing time of the preset cycle among the cycles and the start time point of the second period within the processing time of the preset cycle, the controller increases the first time difference by a preset time length.

In case that the parameter does not exceed the first threshold value during the time period from the output start time point to the start time point of the second period, there is a likelihood that the second gas is not sufficiently supplied into the processing vessel by the start time point of the second period. In the present exemplary embodiment, if the parameter does not exceed the first threshold value during the time period from the output start time point to the start time point of the second period, the first time difference is adjusted in order to move up the output start time point of the next cycle. Accordingly, the time difference between the time point when the second gas is supplied into the processing vessel and the time point when the second high frequency power is supplied to the second electrode is reduced.

In the plasma processing method, if the parameter exceeding a second threshold value is obtained by the operation unit during a time period between the output stop time point of the second period within a processing time of a preset cycle among the cycles and the end time point of the second period within the processing time of the preset cycle, the controller decreases the second time difference by a time difference between a time point when the parameter exceeding the second threshold value is obtained and the end time point of the second period within the processing time of the preset cycle.

If the supply of the second gas into the processing vessel is ended, the impedance of the plasma is changed, so that the parameter is increased. In the present exemplary embodiment, the time point when this parameter exceeds the second threshold value is used as the time point when the supply of the second gas into the processing vessel is ended. Further, if the time point when the parameter exceeds the second threshold value precedes the end time point of the second period, it is determined that the supply of the second gas into the processing vessel is ended before the end time point of the second period. Thus, the second time difference is adjusted in order to delay the output stop time point of the next cycle. Accordingly, the time difference between the time point when the supply of the second gas into the processing vessel is ended and the end time point of the second stage is reduced.

In the plasma processing method, if the parameter exceeding the second threshold value is not obtained by the operation unit during the time period between the output stop time point of the second period within the processing time of the preset cycle among the cycles and the end time point of the second period within the processing time of the preset cycle, the controller increases the second time difference by a preset time length.

In case that the parameter does not exceed the second threshold value during the time period from the output stop time point to the end time point of the second period, there is a likelihood that the second gas is still supplied into the processing vessel even at the end time point of the second period. In the exemplary embodiment, if the parameter does not exceed the second threshold value during the time period from the output stop time point to the end time point of the second period, the second time difference is adjusted in order to move up the output stop time point of the next cycle. Accordingly, the time difference between the time point when the supply of the second gas into the processing vessel is ended and the end time point of the second stage is reduced.

As stated above, in the plasma processing method in which the multiple cycles, each of which includes the first stage of generating the plasma of the first processing gas containing the first gas and the second stage of generating the plasma of the second processing gas containing the first gas and the second gas, are performed, it is possible to decide the time difference between the start time point of the time period during which the second stage is performed and the start time point of the output of the second gas from the gas supply system automatically according to the recipe. Further, it is also possible to decide the time difference between the end time point of the time period during which the second stage is performed and the stop time point of the output of the second gas from the gas supply system automatically according to the recipe.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
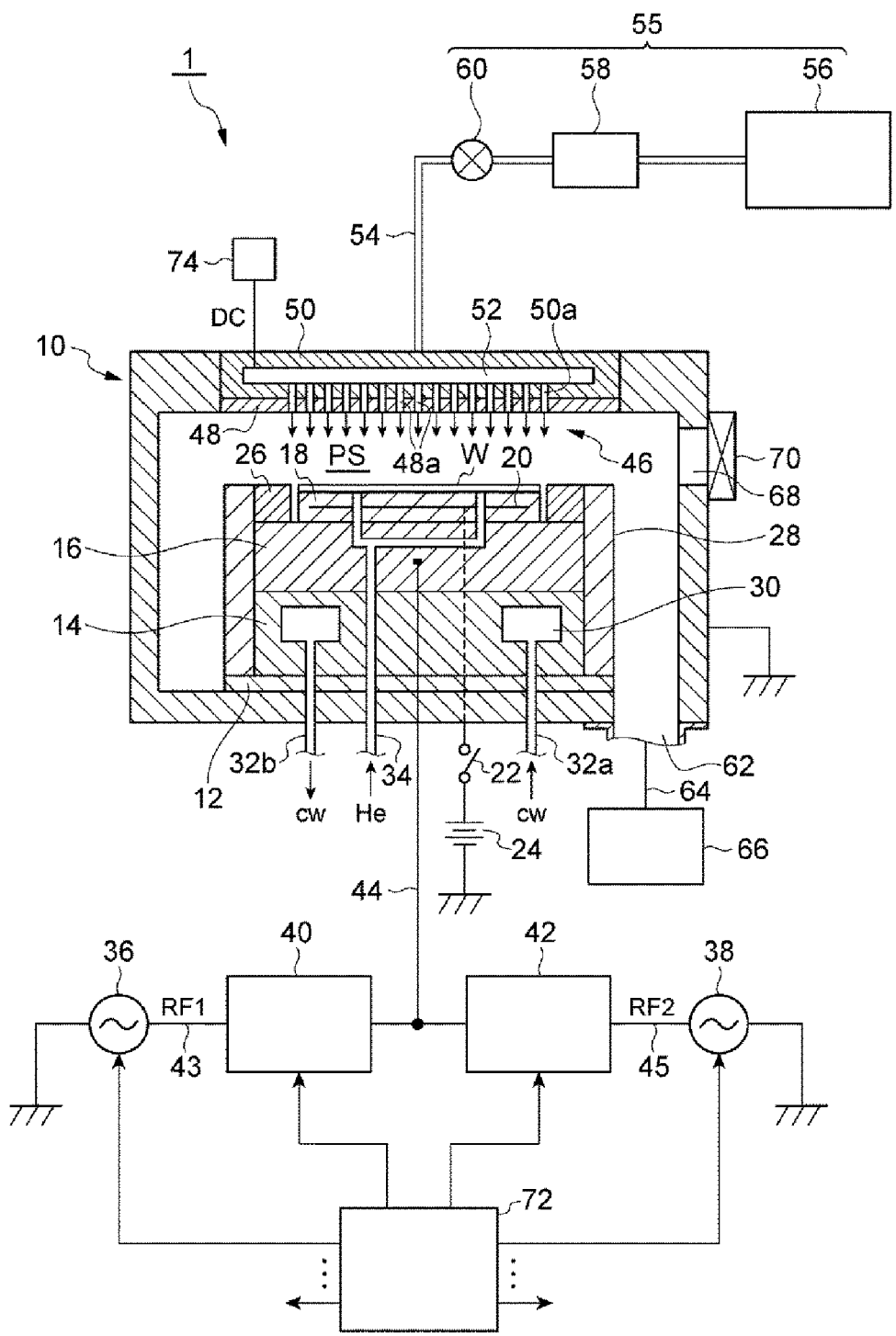
FIG. 1 is a diagram schematically illustrating a configuration of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a plasma processing apparatus capable of performing a plasma processing method according to an exemplary embodiment will be described. FIG. 1 is a diagram schematically illustrating a configuration of a plasma processing apparatus according to an exemplary embodiment. The plasma processing apparatus 1 shown in FIG. 1 is configured as a capacitively coupled plasma processing apparatus. The plasma processing apparatus 1 includes a processing vessel 10. The processing vessel 10 has a substantially cylindrical shape, and is made of a material such as aluminum. An inner wall surface of the processing vessel 10 is anodically oxidized. The processing vessel 10 is grounded.

An insulating plate 12 is provided at a bottom portion of the processing vessel 10. The insulating plate 12 is made of, by way of non-limiting example, ceramic. A supporting table 14 is provided on the insulating plate 12. The supporting table 14 has a substantially circular column shape, and a susceptor 16 is provided on the supporting table 14. The susceptor 16 is made of a conductive material such as aluminum, and is configured as a lower electrode (second electrode).

An electrostatic chuck 18 is provided on the susceptor 16. The electrostatic chuck 18 has a structure in which an electrode 20 made of a conductive film is embedded between insulating layers or between insulating sheets. The electrode 20 of the electrostatic chuck 18 is electrically connected to a DC power supply 24 via a switch 22. The electrostatic chuck 18 is configured to generate an electrostatic attracting force by a DC voltage applied from the DC power supply 24, and hold a processing target object W thereon by this electrostatic attracting force. The processing target object W may be a disk-shaped object such as a wafer. A focus ring 26 is disposed on the susceptor 16 to surround the electrostatic chuck 18. Further, a cylindrical inner wall member 28 is disposed on side surfaces of the susceptor 16 and the supporting table 14. This inner wall member 28 is made of, but not limited to, quartz.

A coolant path 30 is formed within the supporting table 14. For example, the coolant path 30 is extended in a spiral shape around a central axis line which is extended in a vertical direction. A coolant cw (for example, cooling water) is supplied through a pipeline 32a into the coolant path 30 from a chiller unit provided at the outside of the processing vessel 10. The coolant supplied into the coolant path 30 is then returned back into the chiller unit via a pipeline 32b. By adjusting a temperature of the coolant through the chiller unit, a temperature of the processing target object W can be adjusted. Further, in the plasma processing apparatus 1, a heat transfer gas (e.g., a He gas) supplied through a gas supply line 34 is introduced into a gap between a top surface of the electrostatic chuck 18 and a rear surface of the processing target object W.

A conductor 44 (e.g., a power feed rod) is connected to the susceptor 16. A high frequency power supply 36, i.e., a first high frequency power supply is connected to the conductor 44 via a matching device 40, i.e., a first matching device, and a high frequency power supply 38, i.e., a second high frequency power supply is also connected to this conductor 44 via a matching device 42, i.e., a second matching device. The high frequency power supply 36 is configured to output a high frequency power RF1 for plasma generation, i.e., a first high frequency power. A basic frequency $f_{B1}$ of the high frequency power RF1 output from the high frequency power supply 36 is, for example, 100 MHz. The high frequency power supply 38 is configured to output a high frequency power RF2 for attracting ions from plasma into the processing target object W, i.e., a second high frequency power. A basic frequency $f_{B2}$ of the high frequency power RF2 output from the high frequency power supply 38 is, for example, 13.56 MHz.

The matching device 40 and the conductor 44 constitute a part of a power feed line 43, i.e., a first power feed line, which is configured to transmit the high frequency power RF1 from the high frequency power supply 36 to the susceptor 16. Further, the matching device 42 and the conductor 44 constitute a part of a power feed line 45, i.e., a second power feed line, which is configured to transmit the high frequency power RF2 from the high frequency power supply 38 to the susceptor 16.

An upper electrode 46 is provided at a ceiling portion of the processing vessel 10. A processing space PS in which plasma is generated is formed between the upper electrode 46 and the susceptor 16 within the processing vessel 10. In the exemplary embodiment, a DC power supply 74 is connected to the upper electrode 46. The DC power supply 74 is configured to apply a negative DC voltage DC to the upper electrode 46. The upper electrode 46 has a ceiling plate 48 and a supporting body 50. The ceiling plate 48 is provided with a multiple number of gas discharge holes 48a. The ceiling plate 48 is made of a silicon-based material such as, but not limited to, Si or SiC. The supporting body 50 is a member which supports the ceiling plate 48 in a detachable manner and is made of aluminium. A surface of the supporting body 50 is anodically oxidized.

A gas buffer room 52 is provided within the supporting body 50. Further, the supporting body 50 is provided with a multiple number of gas through holes 50a. The gas through holes 50a are extended from the gas buffer room 52 and communicated with the gas discharge holes 48a, respectively. The gas buffer room 52 is connected with a gas supply system 55 via a gas supply line 54. The gas supply system 55 includes a gas source group 56, a flow rate controller group 58 and a valve group 60. The gas source group 56 includes a plurality of gas sources. The flow rate controller group 58 includes a multiple number of flow rate controllers. Here, the flow rate controllers may be implemented by, by way of non-limiting example, mass flow controllers. Further, the valve group 60 includes a multiple number of valves. Each of the plurality of gas sources of the gas source group 56 is connected to the gas supply line 54 via each corresponding flow rate controller of the flow rate controller group 58 and each corresponding valve of the valve group 60. The gas supply system 55 is configured to supply a gas from a gas source selected from the plurality of gas sources into the gas buffer room 52 at a controlled flow rate. The gas introduced into the gas buffer room 52 is discharged into the processing space PS through the gas discharge holes 48a.

When viewed from the top, an annular space is formed between the susceptor 16 and a sidewall of the processing vessel 10 and between the supporting table 14 and the sidewall of the processing vessel 10. A bottom portion of the space is connected to an exhaust opening 62 of the processing vessel 10. An exhaust line 64 communicating with the exhaust opening 62 is connected to a bottom portion of the processing vessel 10. The exhaust line 64 is connected to an exhaust device 66. The exhaust device 66 is equipped with a vacuum pump such as a turbo molecular pump, and is configured to decompress the internal space of the processing vessel 10 to a required pressure level. Further, an opening 68 for carry-in/out of the processing target object W is formed at the sidewall of the processing vessel 10. A gate valve 70 for opening/closing the opening 68 is provided at the sidewall of the processing vessel 10.

Further, the plasma processing apparatus 1 is equipped with a controller 72. The controller 72 includes one or more microcomputers. The controller 72 controls operations of individual components of the plasma processing apparatus 1, e.g., the high frequency power supplies 36 and 38, the matching devices 40 and 42, the DC power supply 74, the gas supply system 55 (i.e., the multiple number of flow rate controllers of the flow rate controller group 58 and the multiple number of valves of the valve group 60) and the exhaust device 66, and controls an overall operation of the plasma processing apparatus 1 according to software (programs) and recipe stored in an external memory or an internal memory. Further, the controller 72 is connected with a manipulation panel for man-machine interface including an input device such as a keyboard and a display such as a liquid crystal display, and an external memory device configured to store various programs and various data such as recipes and setting values.

A basic operation of the plasma processing apparatus is performed as follows. First, the gate valve 70 is opened, and the processing target object W is carried into the processing vessel 10 through the opening 68. The processing target object W carried into the processing vessel 10 is placed on the electrostatic chuck 18. Then, a gas is introduced into the processing vessel 10 from the gas supply system 55, and the exhaust device 66 is operated such that a pressure in the internal space of the processing vessel 10 is set to a preset pressure value. Further, the high frequency power RF1 from the high frequency power supply 36 is supplied to the susceptor 16, and, when necessary, the high frequency power RF2 from the high frequency power supply 38 is supplied to the susceptor 16. Further, the DC voltage DC from the DC power supply 74 is applied to the upper electrode 46 when necessary. Further, the DC voltage from the DC power supply 24 is applied to the electrode 20 of the electrostatic chuck 18, and the processing target object W is held on the electrostatic chuck 18. The gas supplied into the processing vessel 10 is excited by high frequency electric field generated between the susceptor 16 and the upper electrode 46. As a result, plasma is generated. The processing target object W is processed by radicals and/or ions from the generated plasma. Further, in case that the high frequency power RF2 is supplied from the high frequency power supply 38 to the susceptor 16, energy of the ions that collide with the processing target object W can be increased. In addition, in case that the DC voltage DC from the DC power supply 74 is applied to the upper electrode 46, positive ions are attracted to and collide with the upper electrode 46. As a result, secondary electrons are emitted from the upper electrode 46, and/or a material that forms the upper electrode 46, for example, silicon is released from the upper electrode 46.

Figure 2:
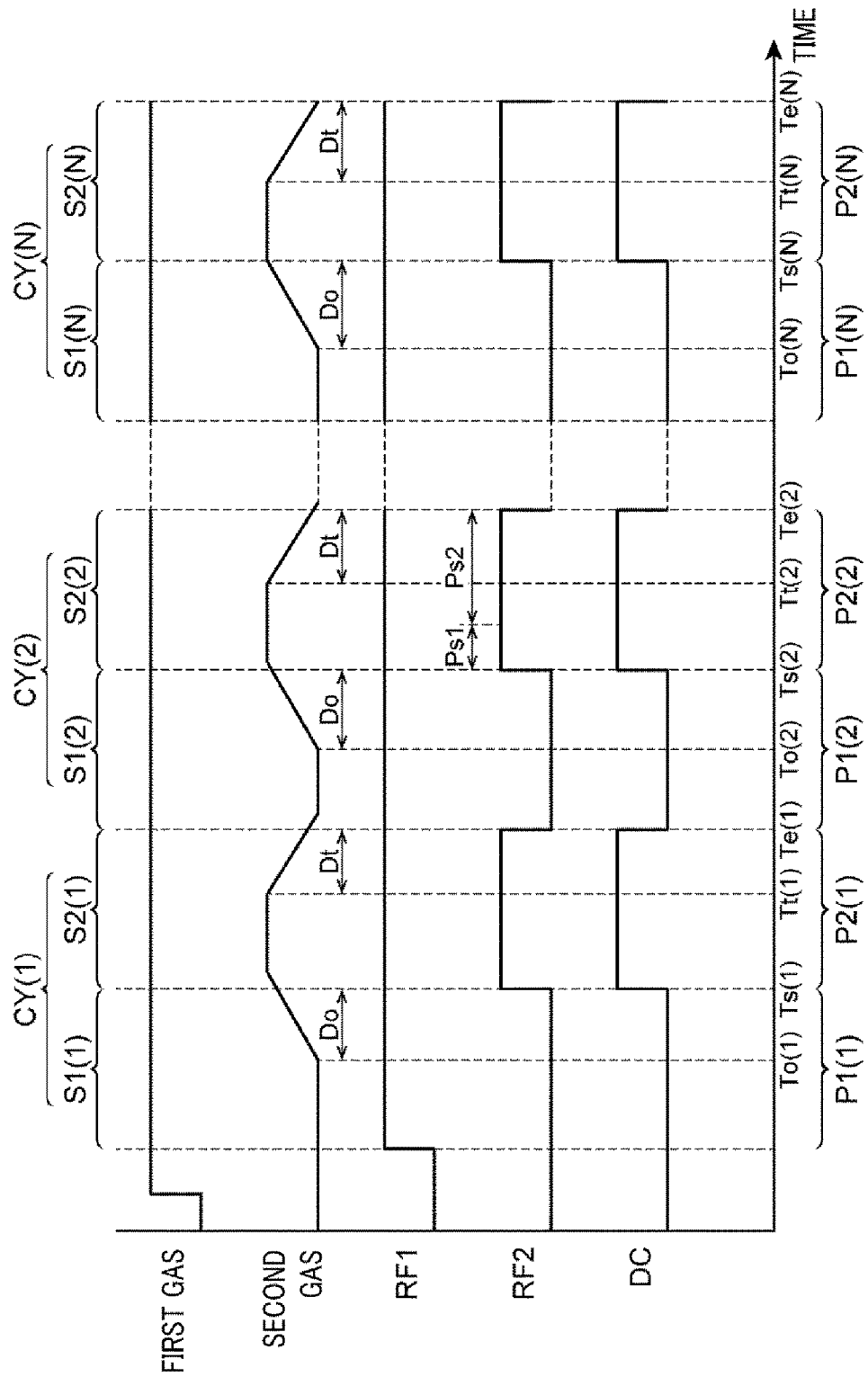
FIG. 2 is a timing chart for a plasma processing method according to the exemplary embodiment.
Figure 3:
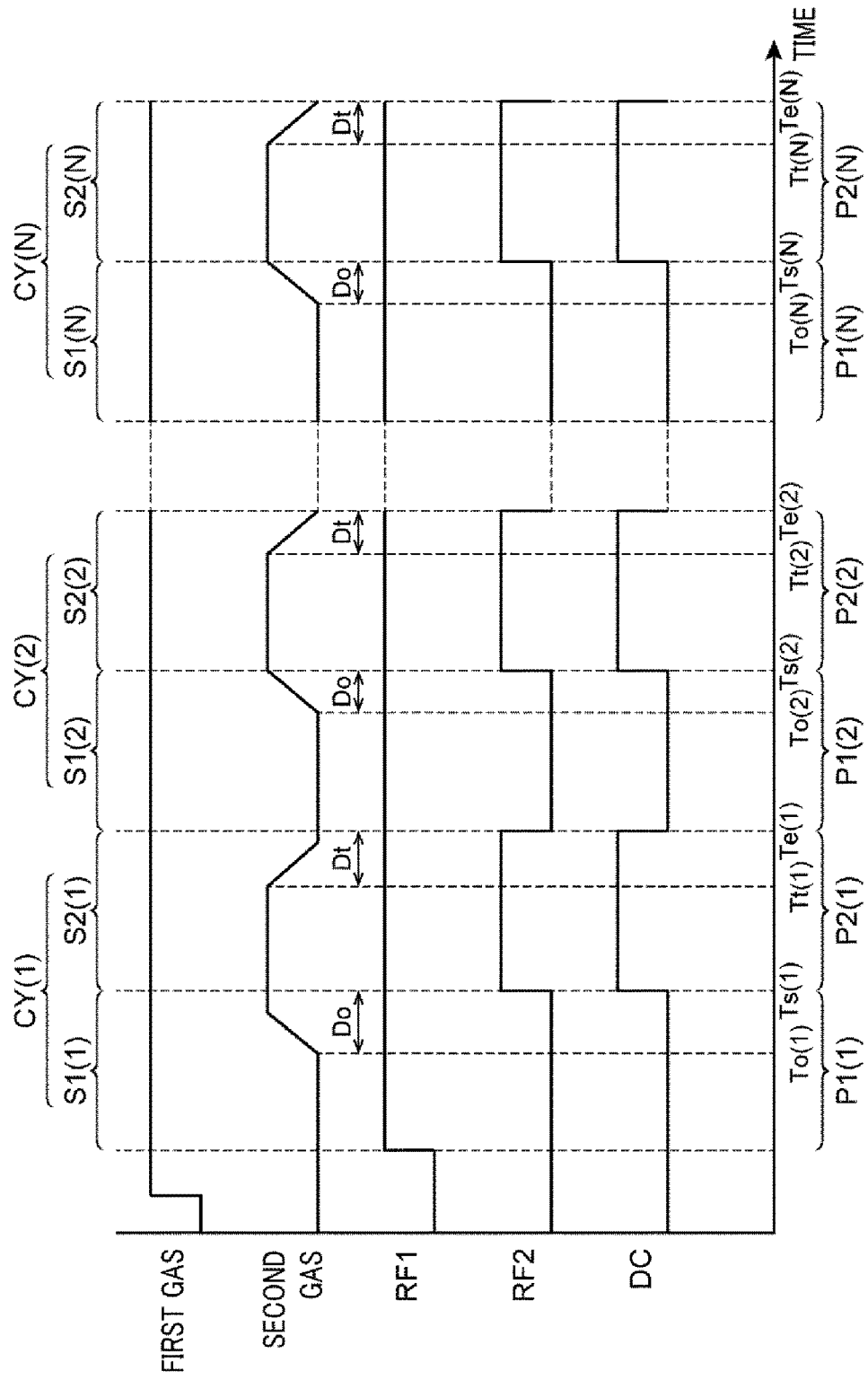
FIG. 3 is a timing chart for a plasma processing method according to the exemplary embodiment.

Now, a plasma processing method according to the exemplary embodiment (hereinafter, referred to as "method MT") will be explained. FIG. 2 and FIG. 3 are timing charts for the plasma processing method according to the exemplary embodiment. The method MT can be performed by using the plasma processing apparatus 1. In each of FIG. 2 and FIG. 3, timing charts of a first gas, a second gas, a high frequency power RF1 and a high frequency power RF2 of the method MT are individually presented. In FIG. 2 and FIG. 3, a horizontal axis represents time. Further, a level of the timing chart of the first gas indicates the amount of the first gas supplied into the processing vessel 10. Further, a level of the timing chart of the second gas represents the amount of the second gas supplied into the processing vessel 10. Furthermore, on the timing chart of the high frequency power RF1, a high level of the high frequency power RF1 indicates that the high frequency power RF1 is supplied to the susceptor 16, whereas a low level of the high frequency power RF1 indicates that the high frequency power RF1 is not supplied to the susceptor 16. Likewise, on the timing chart of the high frequency power RF2, a high level of the high frequency power RF2 indicates that the high frequency power RF2 is supplied to the susceptor 16, whereas a low level of the high frequency power RF2 indicates that the high frequency power RF2 is not supplied to the susceptor 16 or indicates that a high frequency power RF2 having a power level lower than that of the high frequency power RF2 having the high level is supplied to the susceptor 16. In addition, on the timing chart of the DC voltage DC, a high level of the DC voltage DC indicates that the DC voltage DC is applied to the upper electrode 46, whereas a low level of the DC voltage DC indicated that the DC voltage DC is not applied thereto.

As depicted in FIG. 2 and FIG. 3, in the method MT, multiple cycles CY are performed in sequence. Each of the multiple cycles CY includes a first stage S1 of generating plasma of a first processing gas; and a second stage S2 of generating plasma of a second processing gas immediately after the first stage S1. In each of the multiple cycles CY, the first stage S1 is performed during a first period P1, and the second stage S2 is performed in a second period P2 which follows the first period P1.

Now, the multiple cycles or each of the multiple cycles will be denoted by "CY". Further, a notation of "CY(i)" is used to present each of the multiple cycles along with its operation order. Furthermore, a notation of "S1(i)" is used to indicate the first stage S1 along with the operation order of a cycle in which the corresponding first stage S1 is included; and a notation of "S2(i)" is used to indicate the second stage S2 along with the operation order of a cycle in which the corresponding second stage S2 is included. In addition, a notation of "P1(i)" is used to present the first period P1 along with the operation order of the corresponding cycle; and a notation of "P2(i)" is used to indicate the second period P2 along with the operation order of the corresponding cycle. Moreover, a notation "Ts" denotes a start time point of the second period P2, and a notation "Te" refers to an end time point of the second period P2. Further, a notation of "Ts(i)" is used to present the start time point Ts along with the operation order of the corresponding cycle; and a notation of "Te(i)" is used to indicate the end time point Te along with the operation order of the corresponding cycle. Additionally, notations of "To" and "Tt" are used to indicate an output start time point of a second gas and an output stop time point of the second gas to be described later, respectively. Further, a notation of "To(i)" is used to indicate the output start time point To with the operation order of the corresponding cycle, and a notation of "Tt(i)" is used to recite the output stop time point Tt with the operation order of the corresponding cycle. Here, "i" represents an integer between 1 and N inclusive, and "N" denotes an integer equal to or larger than 2.

In the first stage S1, plasma of a first processing gas is generated within the processing vessel 10 in which the processing target object W is accommodated. The first processing gas contains a first gas. The first gas may be, but not limited to, a rare gas such as an Ar gas and/or a fluorocarbon gas. To generate the plasma of the first processing gas in the first stage S1, the controller 72 controls gas supply system 55. To elaborate, the controller 72 outputs a gas supply control signal to the gas supply system 55. In response to the gas supply control signal, the gas supply system 55 opens a valve of the valve group 60 connected to a gas source for the first processing gas, and sets an output flow rate of a flow rate controller of the flow rate controller group 58 connected to the corresponding gas source to a preset value according to a recipe. The supply of the first processing gas from the gas supply system 55 is begun prior to a start time point of a first period P1(1) during which a first stage S1(1) of the first cycle CY(1) is performed. The supply of the first gas is continued in a second period P2 which follows the first period P1 immediately.

Further, to generate the plasma of the first processing gas in the first stage S1, the controller 72 controls the high frequency power supply 36 to supply the high frequency power RF1 to the susceptor 16. The supply of the high frequency power RF1 is begun at the start time point of the first period P1(1) of the first cycle CY, and is continued in the second period P2 as well which follows the first period P1. Further, in the first period P1, the high frequency power RF2 from the high frequency power supply 38 is not supplied to the susceptor 16. Alternatively, in the first period P1, a high frequency power RF2 having a power level lower than that of the high frequency power RF2 supplied from the high frequency power supply 38 to the susceptor 16 in the second period P2 may be supplied to the susceptor 16 from the high frequency power supply 38.

In the second stage S2, plasma of a second processing gas is generated within the processing vessel 10 in which the processing target object W is accommodated. The second processing gas contains the above-described first gas. Further, the second processing gas additionally contains a second gas. The second gas is a gas different from the gas contained in the first processing gas. That is, the second processing gas is prepared by adding the second gas to the first gas. The second gas may be, by way of example, but not limitation, a fluorocarbon gas and/or an oxygen gas. To generate the plasma of the second processing gas in the second stage S2, the controller 72 controls the gas supply system 55. To elaborate, the controller 72 outputs a gas supply control signal to the gas supply system 55. In response to the gas supply control signal, the gas supply system 55 opens a valve of the valve group 60 connected to a gas source for the second processing gas, and sets an output flow rate of a flow rate controller of the flow rate controller group 58 connected to the corresponding gas source to a preset value according to a recipe.

Further, in each cycle CY, the controller 72 controls the gas supply system 55 to start the output of the second gas at a output start time point To prior to the start time point Ts of the second period P2. The output start time point To is a time which precedes the start time point Ts of the second period P2, which immediately follows the output start time point To, by a first time difference Do, and, initially, is determined by using a first delay time, as will be described later. Further, in each cycle CY, the controller 72 also controls the gas supply system 55 to stop the supply of the second gas at an output stop time point Tt prior to the end time point Te of the second period P2. The output stop time point Tt is a time point which precedes the end time point Te, which immediately follows the output stop time point Tt, by a second time difference Dt and, initially, is determined by using a second delay time, as will be described later.

Further, as stated above, to generate the plasma of the second processing gas in the second stage S2, the controller 72 controls the high frequency power supply 36 to supply the high frequency power RF1 to the susceptor 16 continuously from the immediately preceding first stage S1. Furthermore, the controller 72 controls the high frequency power supply 38 to supply the high frequency power RF2 to the susceptor 16 in the second period P2 of each cycle CY. In each cycle CY, the supply of the high frequency power RF2 to the susceptor 16 is begun at the start time point Ts of the second period P2 and is finished at the end time point Te of the second period P2. Alternatively, in each cycle CY, the power level of the high frequency power RF2 to be supplied to the susceptor 16 may be increased at the start time point Ts of the second period P2 and may be decreased at the end time point Te of the second period P2.

Further, as an example, the controller 72 may control the DC power supply 74 to apply the DC voltage DC to the upper electrode 46 during a time period from the start time point Ts of the second period P2 to the end time point Te thereof. Alternatively, the DC voltage DC may be applied to the upper electrode 46 only in the first period P1.

Figure 4:
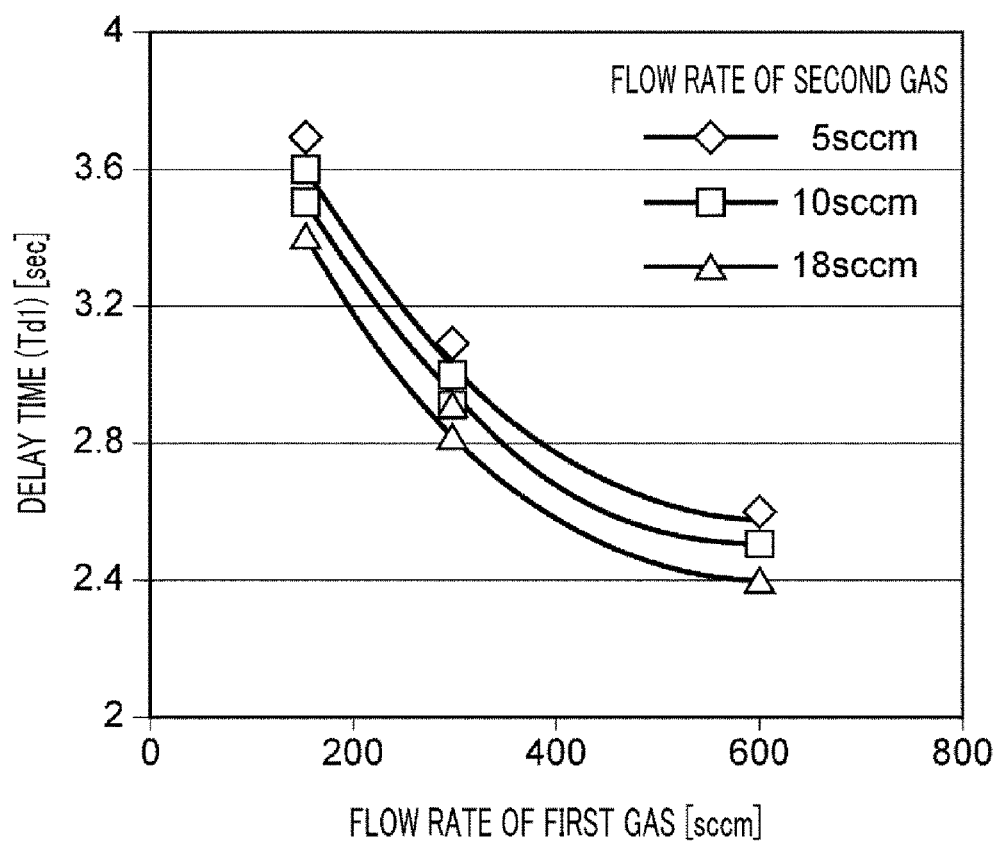
FIG. 4 is a graph showing an experimental result for a delay time Td1.

Here, the first delay time and the second delay time will be explained. By using an optical emission spectrometer (OES), the present inventors have measured, with the flow rate of the first gas and the flow rate of the second gas as variable parameters, a delay time Td1 (sec) from a time point when the gas supply system 55 starts the supply of the second gas up to a time point when light emission caused by the plasma of the second gas is detected within the processing vessel 10 while supplying the first gas into the processing vessel 10. FIG. 4 shows the measurement result. In FIG. 4, a horizontal axis represents the flow rate of the first gas, and a vertical axis indicates the delay time Td1. As depicted in FIG. 4, the delay time Td1 depends on the flow rates of the first gas and the second gas, and it is found out that the delay time Td1 can be defined as a function having the flow rates of the first gas and the second gas as parameters. A function derived from the experimental result of FIG. 4 using the plasma processing apparatus is as follows:

$$Td1 = 5 \times 10^{-6} \times Qm^2 - 0.0064 \times Qm + 4.4778 + (-0.0151 \times Qp + 0.0663).$$

Here, Qm denotes the flow rate of the first gas, and Qp refers to the flow rate of the second gas. As stated above, the delay time Td1 can be defined as a function having the flow rates of the first gas and the second gas as the parameters. Further, instead of being defined as a function, the delay time Td1 may be registered in a table in relation to the flow rates of the first gas and the second gas. The controller 72 may specify a first delay time corresponding to the flow rates of the first gas and the second gas in the second stage S2 designated in a recipe by using the corresponding function or by referring to the corresponding table. Initially, the controller 72 may set the first delay time as the first time difference Do.

Figure 5:
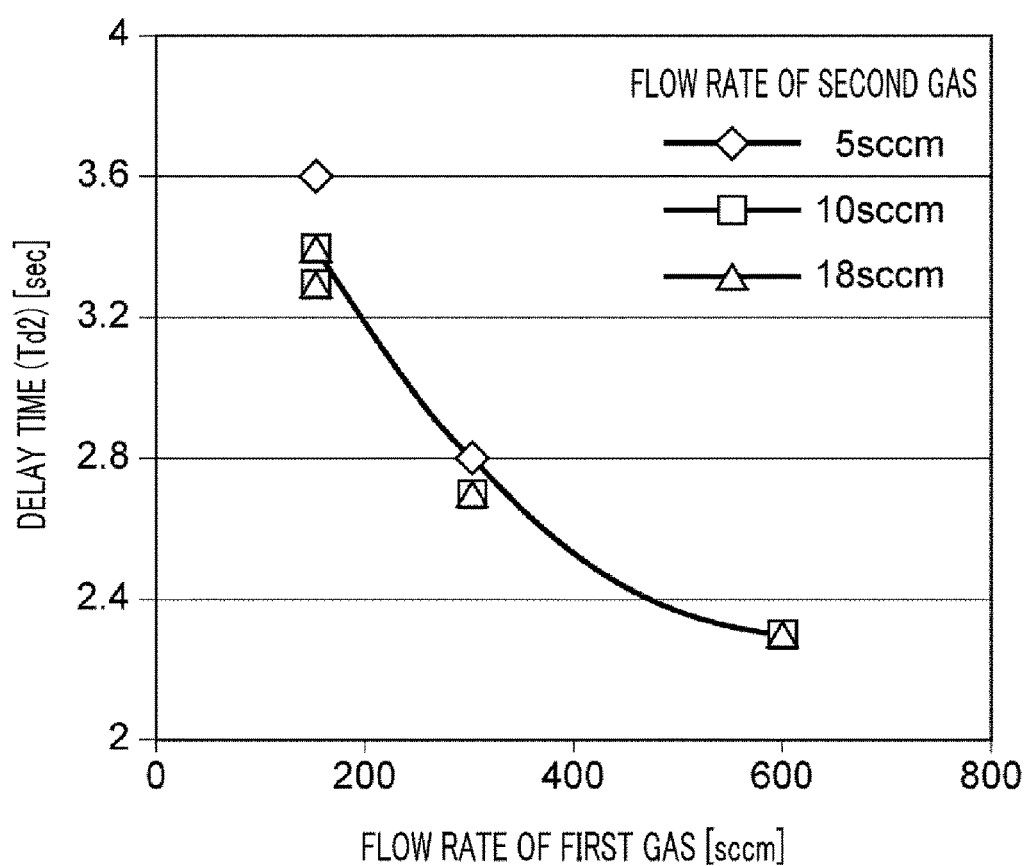
FIG. 5 is a graph showing an experimental result for a delay time Td2.

Further, by using the optical emission spectrometer (OES), the present inventors have also measured, with the flow rate of the first gas and the flow rate of the second gas as variable parameters, a delay time Td2 (sec) from a time point when the gas supply system 55 stops the supply of the second gas up to a time point when light emission caused by the plasma of the second gas is not detected within the processing vessel 10 while supplying the second gas into the processing vessel 10. FIG. 5 shows the measurement result. In FIG. 5, a horizontal axis represents the flow rate of the first gas, and a vertical axis indicates the delay time Td2. As depicted in FIG. 5, the delay time Td2 does not depend on the flow rate of the second gas but depends on the flow rate of the first gas, and it is found out that the delay time Td2 can be defined as a function having the flow rate of the first gas as a parameter. A function derived from the experimental result of FIG. 5 using the plasma processing apparatus is as follows:

$$Td2 = 5 \times 10^{-6} \times Qm^2 - 0.0063 \times Qm + 4.2333.$$

Here, Qm denotes the flow rate of the first gas. As stated above, the delay time Td2 can be defined as a function having the flow rate of the first gas as the parameter. Further, instead of being defined as a function, the delay time Td2 may be registered in a table in relation to the flow rate of the first gas. The controller 72 may specify a second delay time corresponding to the flow rate of the first gas in the second stage S2 designated in a recipe by using the corresponding function or by referring to the corresponding table. Initially, the controller 72 may set the second delay time as the second time difference Dt.

Furthermore, according to the exemplary embodiment, the controller 72 is configured to adjust the first time difference To and the second time difference Tt for a cycle CY after the first cycle CY(1). The adjustment of each of the first time difference Do and the second time different Dt is performed by using a parameter which relies on an impedance of the plasma. This parameter is calculated by the matching device 40.

Figure 6:
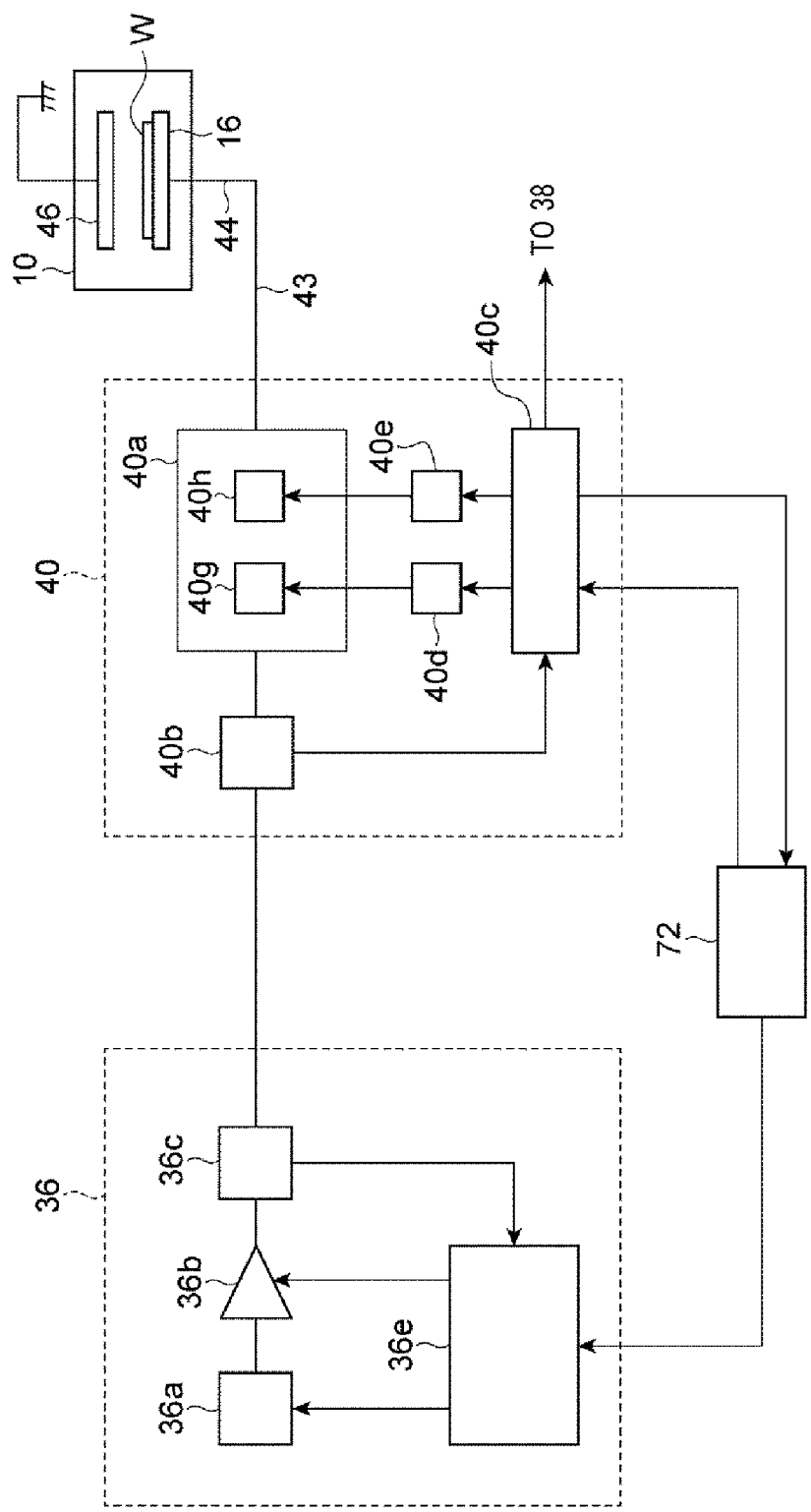
FIG. 6 is a diagram illustrating an example configuration of a high frequency power supply 36 and a matching device 40.
Figure 7:
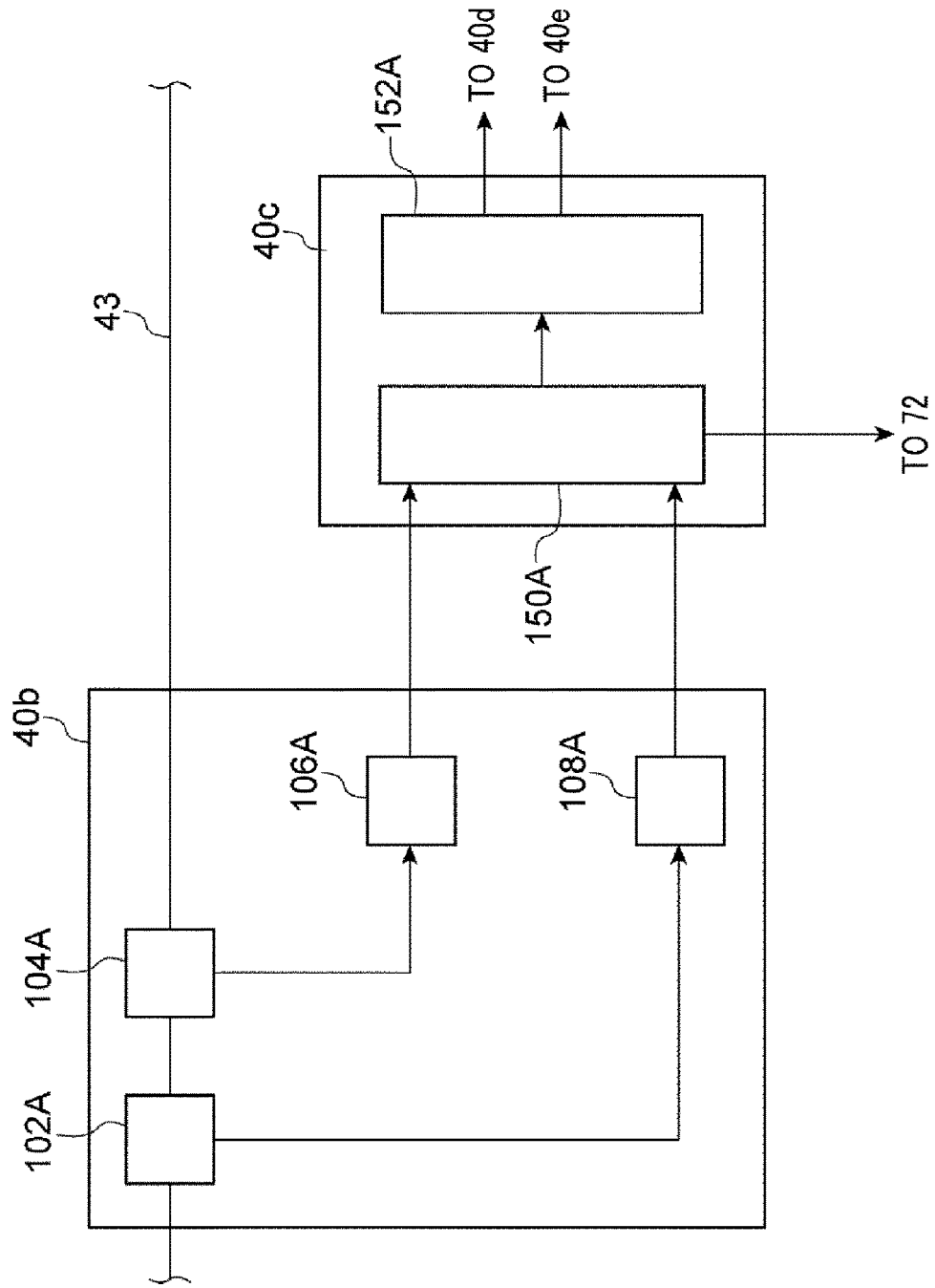
FIG. 7 is a diagram illustrating an example configuration of a sensor and a controller of the matching device 40.
Figure 8:
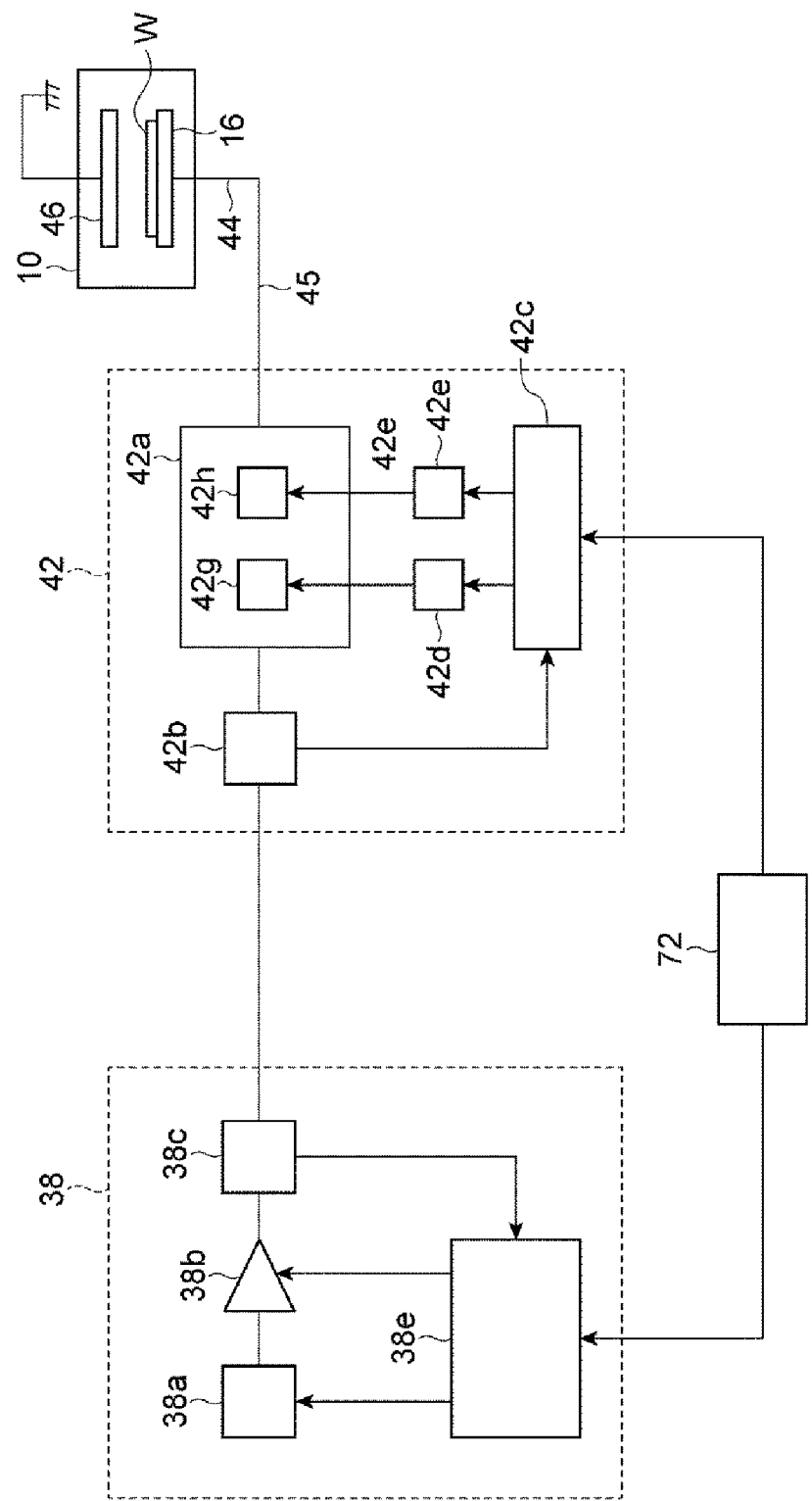
FIG. 8 is a diagram illustrating an example configuration of a high frequency power supply 38 and a matching device 42.
Figure 9:
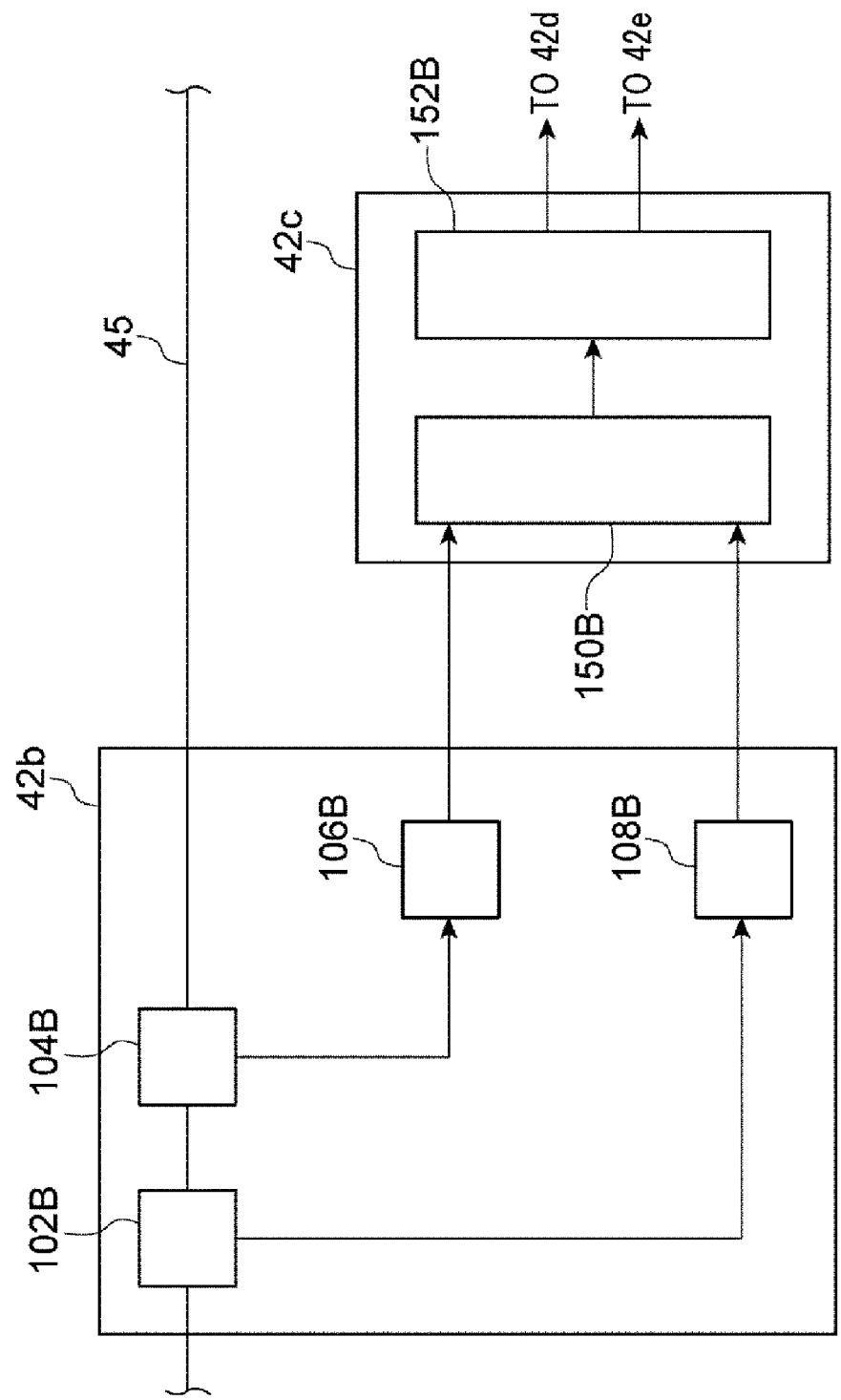
FIG. 9 is a diagram illustrating an example configuration of a sensor and a controller of the matching device 42.

Now, referring to FIG. 6 to FIG. 9, the high frequency power supply 36 and the matching device 40, and the high frequency power supply 38 and the matching device 42 will be elaborated. FIG. 6 is a diagram illustrating an example configuration of the high frequency power supply 36 and the matching device 40. FIG. 7 is a diagram illustrating an example configuration of a controller and a sensor of the matching device 40. Further, FIG. 8 is a diagram illustrating an example configuration of the high frequency power supply 38 and the matching device 42, and FIG. 9 is a diagram illustrating an example configuration of a controller and a sensor of the matching device 42.

According to the exemplary embodiment, the high frequency power supply 36 includes an oscillator 36a, a power amplifier 36b, a power sensor 36c and a power supply controller 36e, as shown in FIG. 6. The power supply controller 36e is composed of a processor such as a CPU, and controls the oscillator 36a and the power amplifier 36b by applying control signals to the oscillator 36a and the power amplifier 36b individually through the use of a signal applied from the controller 72 and a signal applied from the power sensor 36c based on a recipe.

The signal applied from the controller 72 includes a first high frequency power setting signal. The first high frequency power setting signal is a signal which designates at least a power and a set frequency of the high frequency power RF1. In the present exemplary embodiment, this set frequency is a basic frequency $f_{B1}$. In performing the method MT, in response to the first high frequency power setting signal, the high frequency power supply 36 starts the supply of the high frequency power RF1 to the susceptor 16 at the start time point of the first stage S1 of the first cycle CY(1) is begun, and continues to supply the high frequency power RF1 to the susceptor 16 in the subsequent second stage S2 and in a subsequent cycle CY.

The power supply controller 36e controls the oscillator 36a to output a high frequency power having a frequency designated by the first high frequency power setting signal. An output of the oscillator 36a is connected to an input of the power amplifier 36b. The high frequency power output from the oscillator 36a is input to the power amplifier 36b. The power amplifier 36b amplifies the input high frequency power to output the high frequency power RF1 having a power designated by the first high frequency power setting signal. Accordingly, the high frequency power RF1 is output from the high frequency power supply 36.

The power sensor 36c is provided at a rear end of the power amplifier 36b. The power sensor 36c is equipped with a directional coupler, a progressive wave power detector and a reflection wave power detector. The directional coupler sends a part of a progressive wave of the high frequency power RF1 to the progressive wave power detector, and sends a reflection wave to the reflection wave power detector. A signal specifying the frequency of the high frequency power RF1 is applied to this power sensor 36c from the power supply controller 36e. The progressive wave power detector generates a measurement value of a power of a component having the same frequency as the frequency of the high frequency power RF1 among all frequency components of the progressive wave, i.e., generates a progressive wave power measurement value PF1. This progressive wave power measurement value is sent to the power supply controller 36e for power feedback.

The reflection wave power detector generates a measurement value of a power of a component having the same frequency as the frequency of the high frequency power RF1 among all frequency components of the reflection wave, i.e., generates a reflection wave power measurement value PR11, and also generates a measurement value of a total power of the all frequency components of the reflection wave, i.e., generates a reflection wave power measurement value PR12. The reflection wave power measurement value PR11 is sent to the controller 72 for monitor display. Further, the reflection wave power measurement value PR12 is sent to the power supply controller 36e for protection of the power amplifier 36b.

As shown in FIG. 6, the matching device 40 is equipped with a matching circuit 40a, a sensor 40b, a controller 40c and actuators 40d and 40e. The matching circuit 40a includes variable reactance elements 40g and 40h. The variable reactance elements 40g and 40h may be implemented by, but not limited to, variable capacitors. Further, the matching circuit 40a may further include an inductor or the like.

The controller 40c is composed of, for example, a processor, and is operated under the control of the controller 72. The controller 40c is configured to calculate a load impedance of the high frequency power supply 36 by using a measurement value sent from the sensor 40b. Further, the controller 40c is also configured to adjust a reactance of each of the variable reactance elements 40g and 40h by controlling the actuators 40d and 40e such that the calculated load impedance approximates to an output impedance of the high frequency power supply 36 or a matching point. Each of the actuators 40d and 40e is implemented by, for example, a motor.

Furthermore, the controller 40c calculates a parameter to be described later by using the measurement value sent from the sensor 40b. The controller 40c is configured to perform various processings by using the calculated parameter.

As depicted in FIG. 7, the sensor 40b includes a current detector 102A, a voltage detector 104A, a filter 106A and a filter 108A. The voltage detector 104A is configured to detect a voltage waveform of the high frequency power RF1 transmitted on the power feed line 43 and is configured to output a voltage waveform analog signal indicating the corresponding voltage waveform. This voltage waveform analog signal is input to the filter 106A. The filter 106A is configured to generate a voltage waveform digital signal by digitizing the voltage waveform analog signal input thereto. Further, the filter 106A is configured to generate a filtered voltage waveform signal by extracting, from the voltage waveform digital signal, only the component of the set frequency of the high frequency power RF1 specified by the signal from the controller 72. The filtered voltage waveform signal generated by the filter 106A is sent to an operation unit 150A of the controller 40c. Further, the filter 106A may be composed of, by way of non-limiting example, a FPGA (Field Programmable Gate Array).

The current detector 102A is configured to detect a current waveform of the high frequency power RF1 transmitted on the power feed line 43 and is configured to output a current waveform analog signal indicating the corresponding current waveform. This current waveform analog signal is input to the filter 108A. The filter 108A is configured to generate a current waveform digital signal by digitizing the current waveform analog signal input thereto. Further, the filter 108A is configured to generate a filtered current waveform signal by extracting, from the current waveform digital signal, only a component of the set frequency of the high frequency power RF1 specified by the signal from the controller 72. The filtered current waveform signal generated by the filter 108A is sent to the operation unit 150A of the controller 40c. Further, the filter 108A may be composed of, by way of non-limiting example, a FPGA (Field Programmable Gate Array).

In order to achieve impedance matching in the matching device 40, the operation unit 150A of the controller 40c calculates a load impedance ZL1 of the high frequency power supply 36 by using the filtered voltage waveform signal sent from the filter 106A and the filtered current waveform signal sent from the filter 108A. To elaborate, the operation unit 150A calculates the load impedance ZL1 of the high frequency power supply 36 from an alternating voltage V1 specified by the filtered voltage waveform signal, an alternating current I1 specified by the filtered current waveform signal, and a phase difference φ1 between the alternating voltage V1 and the alternating current I1.

Further, the operation unit 150A is also configured to calculate a parameter to be described later from the alternating voltage V1, the alternating current I1 and the phase difference φ1. The parameter may be the aforementioned load impedance ZL1. In this case, since the load impedance calculated for the impedance matching of the matching device 40 can be used as the parameter, it is not required to calculate the parameter additionally. Alternatively, the parameter may be any one of a load resistance Zr1, a load reactance Zi1 and a reflection wave coefficient Γ1. Still alternatively, any one of the parameters selected from the load impedance ZL1, the load resistance Zr1, the load reactance Zi1 and the reflection wave coefficient Γ1 may be used as the parameter calculated by the operation unit 150A.

The load impedance ZL1 is calculated as V1/I1. The load resistance Zr1 is obtained by calculating a real part of the load impedance ZL1, and the load reactance Zi1 is obtained by calculating an imaginary part of the load impedance ZL1. Further, the reflection wave coefficient Γ1 is calculating by the following Expression 1.

[Expression 1]

$$\Gamma 1 = \frac{\sqrt{(Zr1 - 50)^2 + (Zi1)^2}}{(Zr1 + 50)^2 + (Zi1)^2} \quad (1)$$

Further, the reflection wave coefficient Γ1 may also be calculated as PR11/PF1 by using the progressive wave power measurement value PF1 and the reflection wave power measurement value PR11 obtained by the power sensor 36c.

The operation unit 150A is configured to output the calculated load impedance ZL1 to a matching controller 152A. The matching controller 152A is configured to adjust the reactance of the variable reactance elements 40g and 40h by controlling the actuators 40d and 40e such that the load impedance ZL1 approximates to the output impedance of the high frequency power supply 36 (or the matching point). Accordingly, the impedance matching by the matching device 40 is performed. Further, the matching controller 152A may control the actuators 40d and 40e such that a moving average value of series of the load impedance ZL1 output by the operation unit 150A approximates to the output impedance of the high frequency power supply 36 (or the matching point).

Further, at the time point when the aforementioned parameter exceeds a first threshold value in a period between the output start time point To(i) and the start time point Ts(i), the operation unit 150A notifies the controller 72 of the information that the parameter has exceeded the first threshold value. The controller 72 is configured to decrease the first time difference Do by a time difference between the start time point Ts(i) and the time point when the parameter has exceeded the first threshold value in the period between the output start time point To(i) and the start time point Ts(i) in order to use the first time difference Do in the next cycle CY(i+1) after the cycle CY(i) (for example, refer to the first time difference Do of the cycle CY(2) in FIG. 3). Further, if the parameter does not exceed the first threshold value in the period between the output start time point To(i) and the start time point Ts(i), the operation unit 150A notifies the controller 72 of the information that the parameter has not exceeded the first threshold value. In case that the parameter does not exceed the first threshold value, the controller 72 is configured to increase the first time difference Do by a preset time length in order to use the first time difference Do in the next cycle CY(i+1) after the cycle CY(i) (for example, refer to the first time difference Do of the cycle CY(2) in FIG. 2).

Furthermore, at a time point when the aforementioned parameter exceeds a second threshold value in a period between the output stop time point Tt(i) and the end time point Te(i), the operation unit 150A notifies the controller 72 of the information that the parameter has exceeded the second threshold value. The controller 72 is configured to decrease the second time difference Dt by a time difference between the end time point Te(i) and the time point when the parameter has exceeded the second threshold value in the period between the output stop time point Tt(i) and the end time point Te(i) in order to use the second time difference Dt in the next cycle CY(i+1) after the cycle CY(i) (for example, refer to the second time difference Dt of the cycle CY(2) in FIG. 3). Further, if the parameter does not exceed the second threshold value in the period between the output stop time point Tt(i) and the end time point Te(i), the operation unit 150A notifies the controller 72 of the information that the parameter has not exceeded the second threshold value. In case that the parameter does not exceed the second threshold value, as will be described later, the controller 72 is configured to increase the second time difference Dt by a preset time length in order to use the second time difference Dt in the next cycle CY(i+1) after the cycle CY(i) (for example, refer to the second time difference Dt of the cycle CY(2) in FIG. 2).

Further, the operation unit 150A calculates a moving average value of a series of parameters, and adjusts the aforementioned first and second threshold values by using this moving average value. The series of parameters include a parameter in the state that the impedance matching by the matching device 40 is completed in the second stage S2 of the completed cycle CY or in each of the second stage S2 of the completed cycle CY and the second stage S2 of the cycle CY currently being performed. Each of the parameters included in these series may be the same kind of parameter as the parameter which is compared with the first and second threshold values.

Now, reference is made to FIG. 8. As shown in FIG. 8, according to the exemplary embodiment, the high frequency power supply 38 includes an oscillator 38a, a power amplifier 38b, a power sensor 38c and a power supply controller 38e. The power supply controller 38e is composed of a processor such as a CPU, and controls the oscillator 38a and the power amplifier 38b by applying control signals to the oscillator 38a and the power amplifier 38b individually through the use of a signal applied from the controller 72 and a signal applied from the power sensor 38c.

The signal applied from the controller 72 to the power supply controller 38e includes at least a second high frequency power setting signal. The second high frequency power setting signal is a signal which designates at least a power and a set frequency of the high frequency power RF2 in the second stage S2 of each cycle CY. In the present exemplary embodiment, this set frequency is a basic frequency $f_{B2}$. Further, in case that the high frequency power RF2 is supplied to the susceptor 16 in the first stage S1 of each cycle CY, the second high frequency power setting signal designates a power and a set frequency of the high frequency power RF2 for the first stage S1.

In the method MT according to the exemplary embodiment, in response to the second high frequency power setting signal, the high frequency power supply 38 starts the supply of the high frequency power RF2 to the susceptor 16 at the start time point Ts of the second stage S2 of each cycle, and stops the supply of the high frequency power RF2 to the susceptor 16 or reduces the power level of the high frequency power RF2 at the end time point Te of the second stage S2 of each cycle.

The power supply controller 38e controls the oscillator 38a to output a high frequency power having a frequency designated by the second high frequency power setting signal. An output of the oscillator 38a is connected to an input of the power amplifier 38b. The high frequency power output from the oscillator 38a is input to the power amplifier 38b. The power amplifier 38b amplifies the input high frequency power to output the high frequency power RF2 having a power designated by the second high frequency power setting signal from the output thereof.

The power sensor 38c is provided at a rear end of the power amplifier 38b. The power sensor 38c is equipped with a directional coupler, a progressive wave power detector and a reflection wave power detector. The directional coupler sends a part of a progressive wave of the high frequency power RF2 to the progressive wave power detector, and sends a reflection wave to the reflection wave power detector. A signal specifying the frequency of the high frequency power RF2 is applied to this power sensor 38c from the power supply controller 38e. The progressive wave power detector generates a measurement value of a power of a component having the same frequency as the frequency of the high frequency power RF2 among all frequency components of the progressive wave, i.e., generates a progressive wave power measurement value PF2. This progressive wave power measurement value is sent to the power supply controller 38e for power feedback.

The reflection wave power detector generates a measurement value of a power of a component having the same frequency as the frequency of the high frequency power RF2 among all frequency components of the reflection wave, i.e., generates a reflection wave power measurement value PR21, and also generates a measurement value of a total power of the all frequency components of the reflection wave, i.e., generates a reflection wave power measurement value PR22. The reflection wave power measurement value PR21 is sent to the controller 72 for monitor display. Further, the reflection wave power measurement value PR22 is sent to the power supply controller 38e for protection of the power amplifier 38b.

As shown in FIG. 8, the matching device 42 is equipped with a matching circuit 42a, a sensor 42b, a controller 42c and actuators 42d and 42e. The matching circuit 42a includes variable reactance elements 42g and 42h. The variable reactance elements 42g and 42h may be implemented by, but not limited to, variable capacitors. Further, the matching circuit 42a may further include an inductor or the like.

The controller 42c is composed of, for example, a processor, and is operated under the control of the controller 72. The controller 42c is configured to calculate a load impedance of the high frequency power supply 38 by using a measurement value sent from the sensor 42b. Further, the controller 42c is also configured to adjust a reactance of each of the variable reactance elements 42g and 42h by controlling the actuators 42d and 42e such that the calculated load impedance approximates to an output impedance of the high frequency power supply 38 or a matching point. Each of the actuators 42d and 42e is implemented by, for example, a motor.

As depicted in FIG. 9, the sensor 42b includes a current detector 102B, a voltage detector 104B, a filter 106B and a filter 108B. The voltage detector 104B is configured to detect a voltage waveform of the high frequency power RF2 transmitted on the power feed line 45, and is configured to output a voltage waveform analog signal indicating the corresponding voltage waveform. This voltage waveform analog signal is input to the filter 106B. The filter 106B is configured to generate a voltage waveform digital signal by digitizing the voltage waveform analog signal input thereto. Further, the filter 106B is configured to generate a filtered voltage waveform signal by extracting, from the voltage waveform digital signal, only the component of the set frequency of the high frequency power RF2 specified by the signal from the controller 72. The filtered voltage waveform signal generated by the filter 106B is sent to an operation unit 150B of the controller 42c.

The current detector 102B is configured to detect a current waveform of the high frequency power RF2 transmitted on the power feed line 45, and is configured to output a current waveform analog signal indicating the corresponding current waveform. This current waveform analog signal is input to the filter 108B. The filter 108B is configured to generate a current waveform digital signal by digitizing the current waveform analog signal input thereto. Further, the filter 108B is configured to generate a filtered current waveform signal by extracting, from the current waveform digital signal, only a component of the set frequency of the high frequency power RF2 specified by the signal from the controller 72. The filtered current waveform signal generated by the filter 108B is sent to the operation unit 150B of the controller 42c.

The operation unit 150B of the controller 42c calculates a load impedance ZL2 of the high frequency power supply 38 by using the filtered voltage waveform signal sent from the filter 106B and the filtered current waveform signal sent from the filter 108B. To elaborate, the operation unit 150B calculates the load impedance ZL2 from an alternating voltage V2 specified by the filtered voltage waveform signal, an alternating current I2 specified by the filtered current waveform signal, and a phase difference φ2 between the alternating voltage V2 and the alternating current I2.

The operation unit 150B outputs the calculated load impedance ZL2 to a matching controller 152B. The matching controller 152B adjusts the reactance of the variable reactance elements 42g and 42h by controlling the actuators 42d and 42e such that the load impedance ZL2 approximates to the output impedance of the high frequency power supply 38 (or the matching point). Accordingly, impedance matching by the matching device 42 is achieved. Further, the matching controller 152B may control the actuators 42d and 42e such that a moving average value of series of the load impedance ZL2 output by the operation unit 150B approximates to the output impedance of the high frequency power supply 38 (or the matching point).

Figure 10:
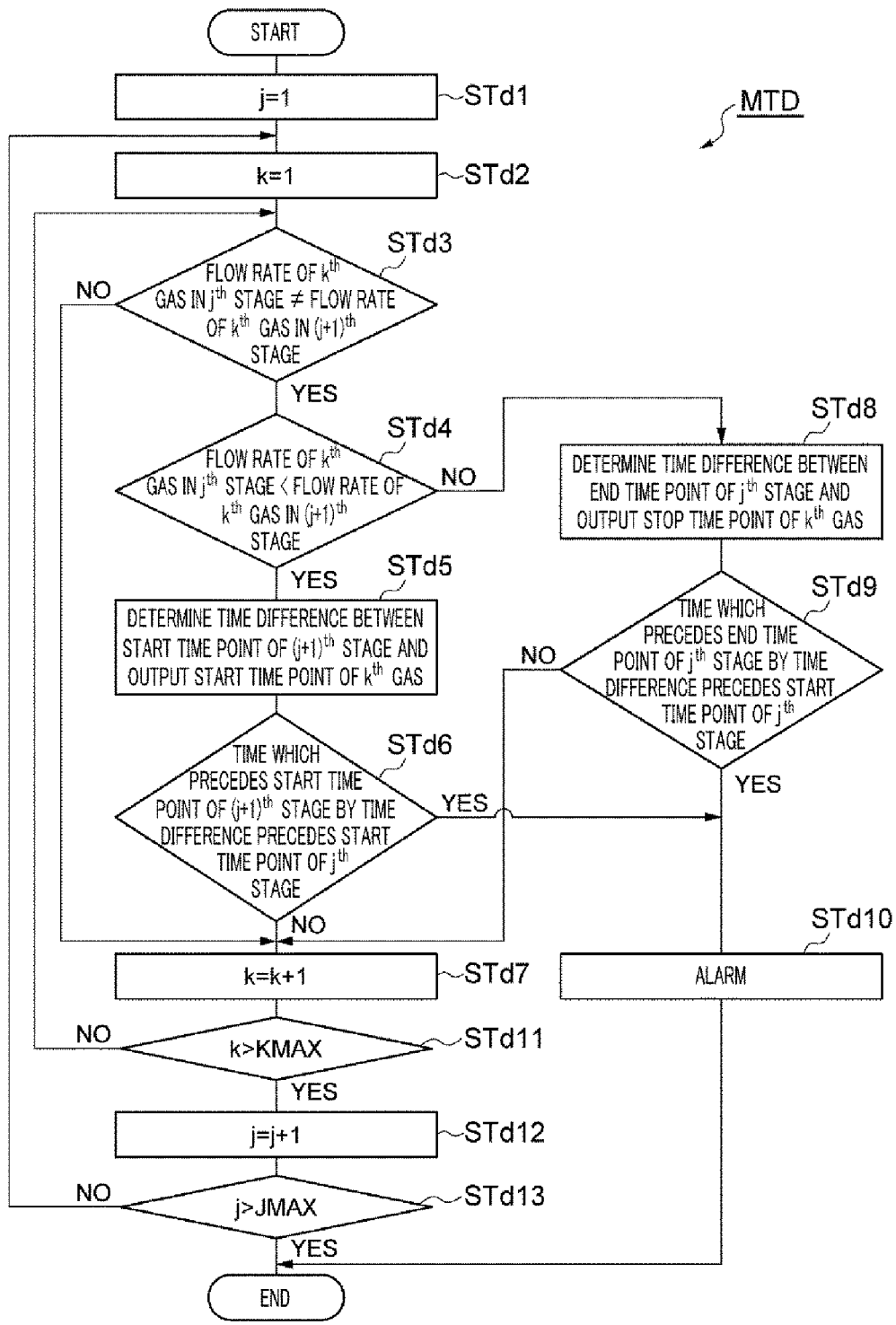
FIG. 10 is a flowchart for describing a method of deciding a time difference between an output start time point and an output stop time point of a gas according to the example embodiment.

Now, a method of deciding the aforementioned time difference regarding the output start time point and the output stop time point of the gas will be explained. FIG. 10 is a flowchart for describing a method of deciding the time difference regarding the output start time point and the output stop time point of the gas according to the exemplary embodiment. In the following description, like the above-described first gas, a gas which is continuously supplied into the processing vessel in two consecutive stages among plural stages belonging to each of multiple sequences is referred to as "main gas."

In the method MTD shown in FIG. 10, j is set to be 1 in a process STd1. "j" is a parameter indicating an order of a plurality of stages included in each of multiple cycles CY. In a subsequent process STd2, k is set to be 1. "k" is a parameter indicating a gas used in the method MT.

In a subsequent process STd3, it is determined whether the flow rate of a $k^{th}$ gas in a $j^{th}$ stage designated in a recipe and a flow rate of the $k^{th}$ gas in a $(j+1)^{th}$ stage designated in the corresponding recipe are same. It should be noted that in case that (j+1) is JMAX+1, "j+1" becomes "1" which indicates an order of a first stage of a next cycle. Here, "JMAX" denotes the total number of the stages included in each of the multiple cycles CY.

If the flow rate of the $k^{th}$ gas in the $j^{th}$ stage and the flow rate of the $k^{th}$ gas in the $(j+1)^{th}$ stage which are designated in the recipe are same, the processing proceeds to a process STd7 to be described later. By way of example, since the flow rate of the first gas in the first stage and the flow rate of the first gas in the second stage shown in FIG. 2 are same, the time difference between the start time point of the second stage and the output start time point of the first gas is not set or set to zero in this case, and the processing proceeds to the process STd7.

Meanwhile, if the flow rate of the $k^{th}$ gas in the $j^{th}$ stage and the flow rate of the $k^{th}$ gas in the $(j+1)^{th}$ stage which are designated in the recipe are different, the processing proceeds to a process STd4. In the process STd4, it is determined whether the flow rate of the $k^{th}$ gas in the $j^{th}$ stage designated in the recipe is smaller than the flow rate of the $k^{th}$ gas in the $(j+1)^{th}$ stage designated in the corresponding recipe. If the flow rate of the $k^{th}$ gas in the $j^{th}$ stage designated in the recipe is smaller than the flow rate of the $k^{th}$ gas in the $(j+1)^{th}$ stage designated in the corresponding recipe, a delay time corresponding to the flow rate of the $k^{th}$ gas and the flow rate of the main gas in the $(j+1)^{th}$ stage is specified from the aforementioned function or table in a subsequent process STd5. This specified delay time is initially set to be a time difference between the start time point of the $(j+1)^{th}$ stage and the output start time point of the $k^{th}$ gas. For example, as shown in FIG. 2, since a flow rate of the second gas in the first stage is smaller than the flow rate of the second gas in the second stage, the delay time (first delay time) corresponding to the flow rate of the first gas as the main gas and the flow rate of the second gas in the second stage is specified from the function or the table, and this specified delay time is initially set to be the time difference (first time difference) between the start time point of the second stage and the output start time point of the second gas.

In a subsequent process STd6, it is determined whether a time point which precedes the start time point of the $(j+1)^{th}$ stage by the time difference set in the process STd5 precedes the start time point of the j$^{th}$ stage. If the time which precedes the start time point of the (j+1)$^{th}$ stage by the time difference set in the process STd5 does not precede the start time point of the j$^{th}$ stage, the processing proceeds to the process STd7. If, however, the time which precedes the start time point of the (j+1)$^{th}$ stage by the time difference set in the process STd5 precedes the start time point of the j$^{th}$ stage, the processing proceeds to a process STd10.

If it is determined in the process STd4 that the flow rate of the k$^{th}$ gas in the j$^{th}$ stage designated in the recipe is larger than the flow rate of the k$^{th}$ gas in the (j+1)$^{th}$ stage designated in the corresponding recipe, a delay time corresponding to the flow rate of the main gas in the j$^{th}$ stage is specified from the aforementioned function or table in a process STd8. This specified delay time is initially set to be a time difference between the end time point of the j$^{th}$ stage and the output stop time point of the k$^{th}$ gas. For example, as shown in FIG. 2, since the flow rate of the second gas in the second stage is larger than the flow rate of the second gas in a first stage of a next cycle, a delay time (second delay time) corresponding to the flow rate of the main gas in the second stage is specified from the function or the table, and this specified delay time is initially set to be the time difference (second time difference) between the end time point of the second stage and the output stop time point of the second gas.

In a subsequent process STd9, it is determined whether a time point which precedes the end time point of the j$^{th}$ stage by the time difference set in the process STd8 precedes the start time point of the j$^{th}$ stage. If the time which precedes the end time point of the j$^{th}$ stage by the time difference set in the process STd8 does not precede the start time point of the j$^{th}$ stage, the processing proceeds to the process STd7. If, however, the time which precedes the end time point of the j$^{th}$ stage by the time difference set in the process STd8 precedes the start time point of the j$^{th}$ stage, the processing proceeds to the process STd10. In the process STd10, an alarm is set off, and the method MTD is ended.

In the process STd7, k is increased by an increment of 1. In a subsequent process STd11, it is determined whether k is larger than KMAX. Here, "KMAX" denotes the total number of gas kinds used in the multiple cycles CY. If it is found out that k is equal to or less than KMAX, the processing returns back to the process STd3. Meanwhile, if k is larger than KMAX, j is increased by an increment of 1 in a subsequent process STd12. Then, in a subsequent process STd13, it is determined whether j is larger than JMAX. If j is found to be equal to or less than JMAX, the processing returns back to the process STd2. Meanwhile, if j is larger than JMAX, the method MTD is ended.

Figure 11:
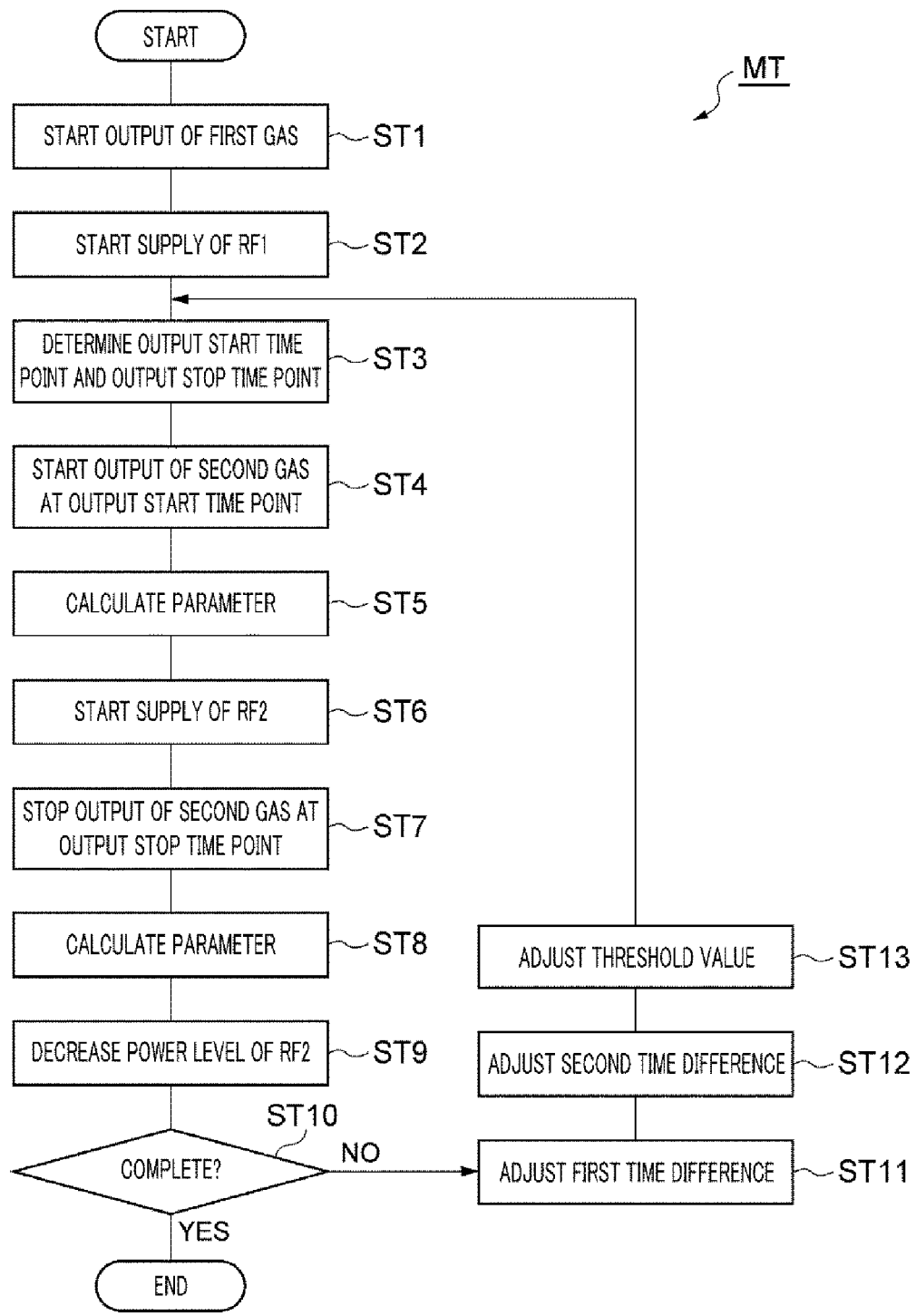
FIG. 11 is a flowchart for describing a plasma processing method according to the example embodiment.

Now, the method MT will be described in detail with reference to FIG. 11 as well as FIG. 2 and FIG. 3. FIG. 11 is a flowchart for describing the plasma processing method according to the exemplary embodiment. In the method MT, processes to be described below are performed based on a recipe under the control of the controller 72. First, in the method MT, a process ST1 is performed. In the process ST1, the output of the first processing gas from the gas supply system 55 is begun prior to performing the first stage S1 of the first cycle CY(1). This first processing gas contains the first gas. Then, the supply of the first gas into the processing vessel 10 is continued throughout the first period P1 during which the first stage S1 of each cycle CY is performed and the second period P2 during which the second stage S2 of each cycle CY is performed.

In a subsequent process ST2, the supply of the high frequency power RF1 to the susceptor 16 by the high frequency power supply 36 is begun. A start time point of the supply of the high frequency power RF1 is the same as the start time point of the first stage S1 of the first cycle CY(1). Then, the supply of the high frequency power RF1 to the susceptor 16 is continued throughout the first period P1 during which the first stage S1 of each cycle CY is performed and the second period P2 during which the second stage S2 of each cycle CY is performed. Further, in case that the high frequency power RF2 is supplied to the susceptor 16 in the first stage S1, a supply of a high frequency power RF2 having a power level lower than that of the high frequency power RF2 supplied to the susceptor 16 in the second stage S2 is begun in the process ST2.

In a period during which the second gas is not supplied into the processing vessel 10 though the first gas is supplied thereto and during which the high frequency power RF1 is supplied to the susceptor 16, that is, in the first period P1, plasma of the first processing gas containing the first gas is generated within the processing vessel 10. That is, the first stage S1 is performed.

In a subsequent process ST3, the output start time point To(i) and the output stop time point Tt(i) of the second gas are determined by the controller 72. To elaborate, the controller 72 sets a time point which precedes the start time point Ts(i) of the second stage S2(i) by the first time difference Do as the output start time point To(i). Further, the controller 72 sets a time point which precedes the end time point Te(i) of the second stage S2(i) by the second time difference Dt as the output stop time point Tt(i). Furthermore, the method MTD described in FIG. 10 is previously performed prior to conducting the first cycle CY(1). To elaborate, the controller 72 acquires the first delay time corresponding to the flow rate of the first gas and the flow rate of the second gas in the second stage S2 designated in the recipe from the aforementioned function or table. Initially, the controller 72 sets this first delay time as the first time difference Do. In addition, prior to conducting the first cycle CY(1), the controller 72 acquires the second delay time corresponding to the flow rate of the first gas in the second stage S2 designated in the recipe from the aforementioned function or table. Initially, the controller 72 sets this second delay time as the second time difference Dt.

In a subsequent process ST4, the gas supply system 55 starts the output of the second gas at the output start time point To(i). Then, in a subsequent process ST5, the calculation of the aforementioned parameter by the operation unit 150A is begun. The operation unit 150A notifies the controller 72 of the information that the parameter exceeds the first threshold value at a time point when the parameter exceeds the first threshold value during a time period from the output start time point To(i) to the start time point Ts(i). Meanwhile, if the parameter does not exceed the first threshold value during the time period from the output start time point To(i) to the start time point Ts(i), the operation unit 150A notifies the controller 72 of the information that the parameter does not exceed the first threshold value.

In a subsequent process ST6, the supply of the high frequency power RF2 to the susceptor 16 is begun. The supply of the high frequency power RF2 to the susceptor 16 is started at the start time point Ts(i) of the second stage S2(i). Alternatively, in case that the high frequency power RF2 is supplied to the susceptor 16 in the first stage S1(i) as well, the power level of the high frequency power RF2 supplied to the susceptor 16 is increased at the start time point Ts(i) of the second stage S2(i). As a result, plasma of the second processing gas is generated within the processing vessel 10.

In a subsequent process ST7, the gas supply system 55 stops the output of the second gas. The output of the second gas is stopped at the output stop time point Tt(i). In a subsequent process ST8, the calculation of the aforementioned parameter by the operation unit 150A is begun. The operation unit 150A notifies the controller 72 of the information that the parameter exceeds the second threshold value at a time point when the parameter exceeds the second threshold value during a time period from the output stop time Tt(i)_to the end time point Te(i). Meanwhile, in case that the parameter does not exceed the second threshold value during the time period from the output stop time Tt(i) to the end time point Te(i), the operation unit 150A notifies the controller 72 of the information that the parameter does not exceed the second threshold value.

In a subsequent process ST9, the supply of the high frequency power RF2 to the susceptor 16 is stopped. The supply of the high frequency power RF2 to the susceptor 16 is stopped at the end time point Te(i). Alternatively, in case that the high frequency power RF2 is supplied to the susceptor 16 in the first stage S1 as well, the power level of the high frequency power RF2 is reduced. In the method MT, the second stage S2 is performed from the process ST6 to the process ST9. Then, the first stage S1 is performed from the process ST9 to the process ST6 of the next cycle CY.

In a subsequent process ST10, it is determined whether all the cycles CY are completed. If it is determined in the process ST10 that all the cycles CY are not completed yet, the supply of the first processing gas into the processing vessel 10 and the supply of the high frequency power RF1 to the susceptor 16 are continued. That is, the first stage S1(i+1) of the cycle CY(i+1) is performed.

Further, if it is determined in the process ST10 that all the cycles CY are not completed yet, the first time difference Do is adjusted in a process ST11. To elaborate, in the process ST5, if it is notified from the operation unit 150A to the controller 72 that the parameter exceeds the first threshold value, the first time difference Do is decreased by the time difference between the start time point Ts(i) and the time point when the parameter exceeds the first threshold value during the time period from the output start time point To(i) to the start time point Ts(i). Meanwhile, if it is notified from the operation unit 150A to the controller 72 that the parameter does not exceed the first threshold value, the first time difference Do is increased by a preset time length.

In a subsequent process ST12, the second time difference Dt is adjusted. To be more specific, in the process ST8, if it is notified from the operation unit 150A to the controller 72 that the parameter exceeds the second threshold value, the second time difference Dt is decreased by the time difference between the end time point Te(i) and the time point when the parameter exceeds the second threshold value during the time period from the output stop time point Tt(i) to the end time point Te(i). Meanwhile, if it is notified from the operation unit 150A to the controller 72 that the parameter does not exceed the second threshold value, the second time difference Dt is increased by a preset time length.

Thereafter, in a process ST13, the first threshold value and the second threshold value are adjusted in the operation unit 150A as stated above. Then, the processing proceeds to the process ST3. Meanwhile, if it is determined in the process ST10 that all the cycles are completed, the method MT is ended.

The delay time between the time point when the gas supply system 55 starts the output of the second gas and the time point when the second gas reaches the processing vessel 10 depends on the flow rates of the first gas and the second gas in the second stage S2. In the method MT, the function or the table is previously created. The function or the table relates the flow rates of the first gas and the second gas to the delay time between the time point when the gas supply system 55 starts the output of the second gas and the time point when the second gas reaches the processing vessel. By using the corresponding function or table, the controller 72 specifies the first delay time corresponding to the flow rates of the first gas and the second gas in the second stage S2 which are designated in the recipe, and sets this first delay time as the first time difference Do initially. The first time difference Do is used to decide the output start time point To(i) of starting the output of the second gas with respect to the start time point Ts(i) of starting the supply of the high frequency power RF2. As stated above, in the method MT, the time difference (that is, the first time difference Do) which decides the output start time point To(i) of starting the output of the second gas with respect to the time point of starting the supply of the high frequency power RF2 can be decided automatically according to the recipe. Further, according to the method MT, the time difference between the time point when the second gas is supplied into the processing vessel 10 and the time point when the high frequency power RF2 is supplied into the susceptor 16 is reduced.

Furthermore, though the time point when the supply of the second gas into the processing vessel is ended is delayed with respect to the time point when the gas supply system 55 stops the output of the second gas, it is desirable that the time difference between the end time point of the second stage S2 and the time point when the supply of the second gas into the processing vessel is ended is small. As described above, the delay time between the time point when the supply of the second gas into the processing vessel 10 is ended and the time point when the gas supply system 55 stops the output of the second gas depends on the flow rate of the first gas in the second stage S2. In the method MT, by using the corresponding function or table, the controller 72 specifies the second delay time corresponding to the flow rate of the first gas designated in the recipe, and sets this second delay time as the second time difference Dt initially. The second time difference Dt is used to decide the output stop time point Tt(i) of stopping the output of the second gas with respect to the end time point Te(i) of the second stage S2. As stated above, in the method MT, the time difference (that is, the second time difference Dt) which decides the output stop time point Tt(i) of stopping the output of the second gas with respect to the end time point Te(i) of the second stage S2(i) can be decided automatically according to the recipe. Further, according to the method MT, the time difference between the time point when the supply of the second gas into the processing vessel 10 is ended and the end time point Te of the second stage S2 can be reduced.

Furthermore, if the second gas is supplied into the processing vessel 10, the impedance of the plasma is changed, so that the parameter is increased. In the method MT, the time point when this parameter exceeds the first threshold value is used as the time point when the second gas is supplied into the processing vessel 10. If the time point when the parameter exceeds the first threshold value precedes the start time point Ts(i) of the second period P2(i), it is determined that the second gas is supplied into the processing vessel 10 before the start time point Ts(i) of the second period P2(i). Thus, the first time difference Do is adjusted in order to delay the output start time point To(i+1) of the next cycle CY(i+1). Accordingly, the time difference between the time point when the second gas is supplied into the processing vessel 10 and the time point when the high frequency power RF2 is supplied to the susceptor 16 is reduced.

In addition, in case that the parameter does not exceed the first threshold value during the time period from the output start time point To(i) to the start time point Ts(i) of the second period P2(i), there is a likelihood that the second gas is not sufficiently supplied into the processing vessel 10 by the start time point Ts(i) of the second period P2(i). In the method MT, if the parameter does not exceed the first threshold value during the time period from the output start time point To(i) to the start time point Ts(i) of the second period P2(i), the first time difference Do is adjusted in order to move up the output start time point To(i+1) of the next cycle CY(i+1). Accordingly, the time difference between the time point when the second gas is supplied into the processing vessel 10 and the time point when the high frequency power RF2 is supplied to the susceptor 16 is reduced.

Moreover, if the supply of the second gas into the processing vessel 10 is ended, the impedance of the plasma is changed, so that the parameter is increased. In the method MT, the time point when this parameter exceeds the second threshold value is used as the time point when the supply of the second gas into the processing vessel 10 is ended. If the time point when the parameter exceeds the second threshold value precedes the end time point Te(i) of the second period P2(i), it is determined that the supply of the second gas into the processing vessel 10 is ended before the end time point Te(i) of the second period P2(i). Thus, the second time difference Dt is adjusted in order to delay the output stop time point Tt(i+1) of the next cycle CY(i+1). Accordingly, the time difference between the time point when the supply of the second gas into the processing vessel 10 is ended and the end time point Te(i) of the second stage S2 is reduced.

Further, in case that the parameter does not exceed the second threshold value during the time period from the output stop time point Tt(i) to the end time point Te(i) of the second period P2(i), there is a likelihood that the second gas is still supplied into the processing vessel 10 even at the end time point Te(i) of the second stage P2(i). In the exemplary embodiment, if the parameter does not exceed the second threshold value during the time period from the output stop time point Tt(i) to the end time point Te(i) of the second period P2(i), the second time difference Dt is adjusted in order to move up the output stop time point Tt(i+1) of the next cycle CY(i+1). Accordingly, the time difference between the time point when the supply of the second gas into the processing vessel 10 is ended and the end time point Te(i) of the second stage S2 is reduced.

Figure 12:
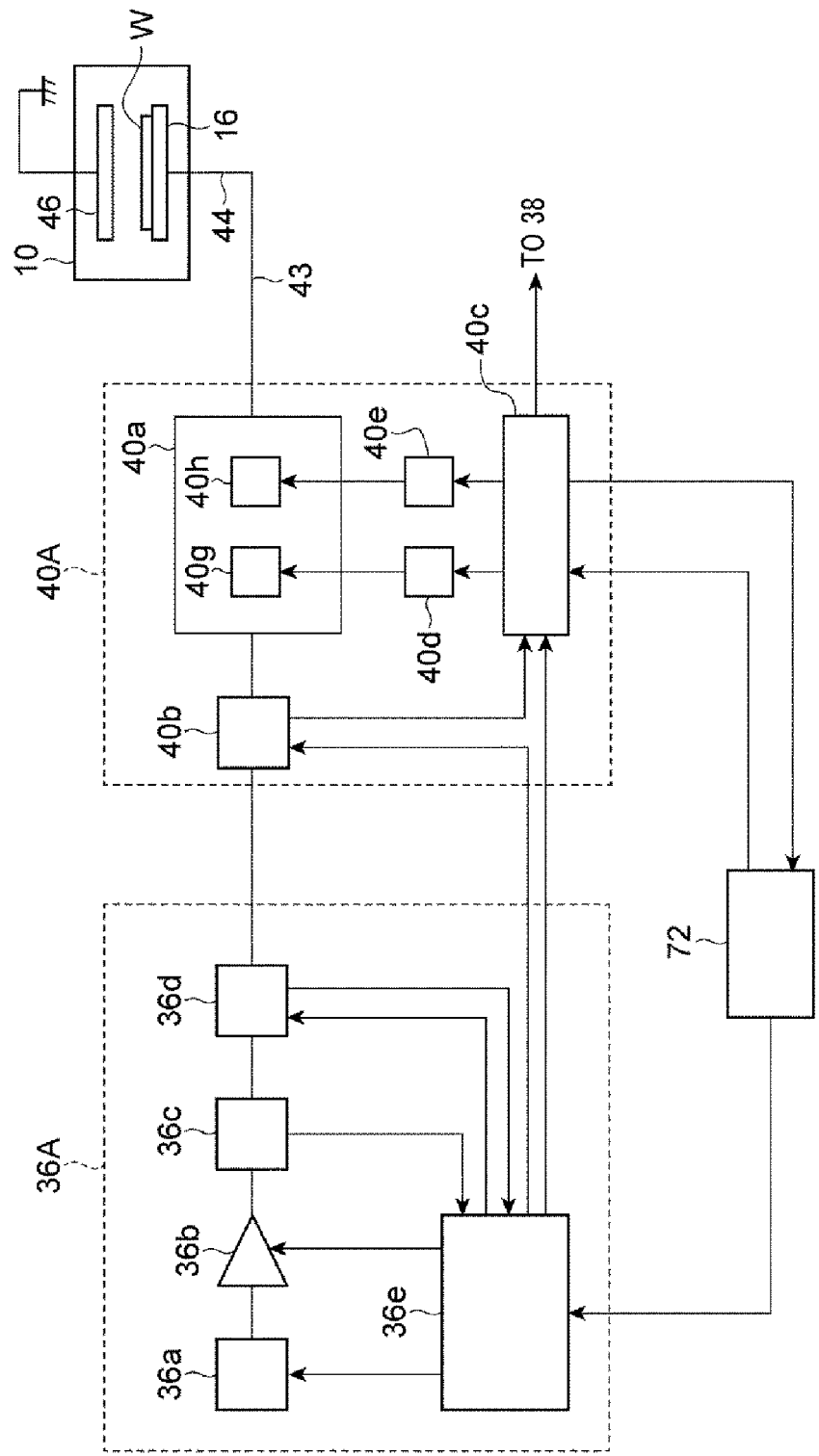
FIG. 12 is a diagram illustrating a configuration of a high frequency power supply 36A and a matching device 40A.
Figure 13:
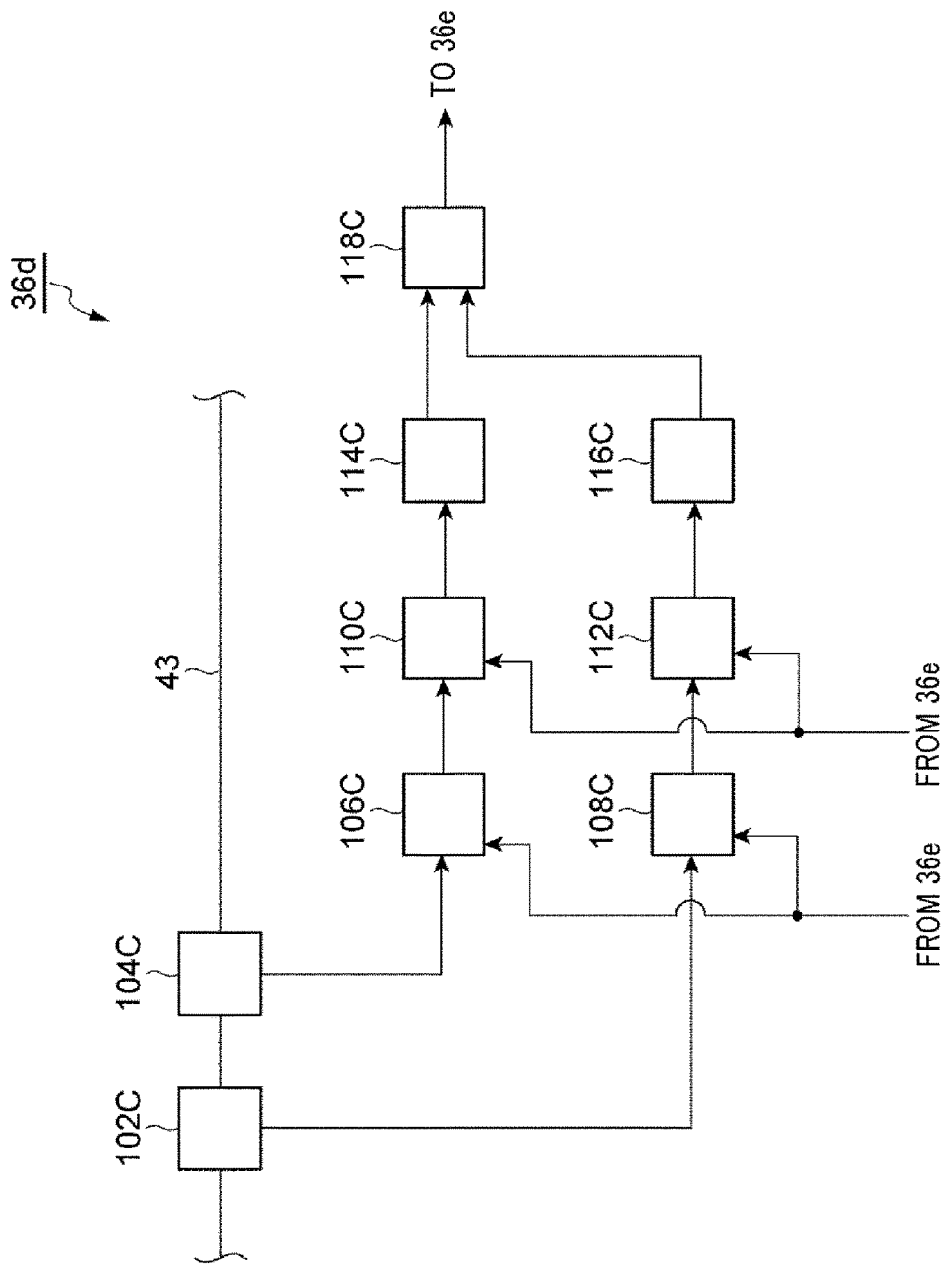
FIG. 13 is a diagram illustrating a configuration of an impedance sensor of the high frequency power supply 36A.
Figure 14:
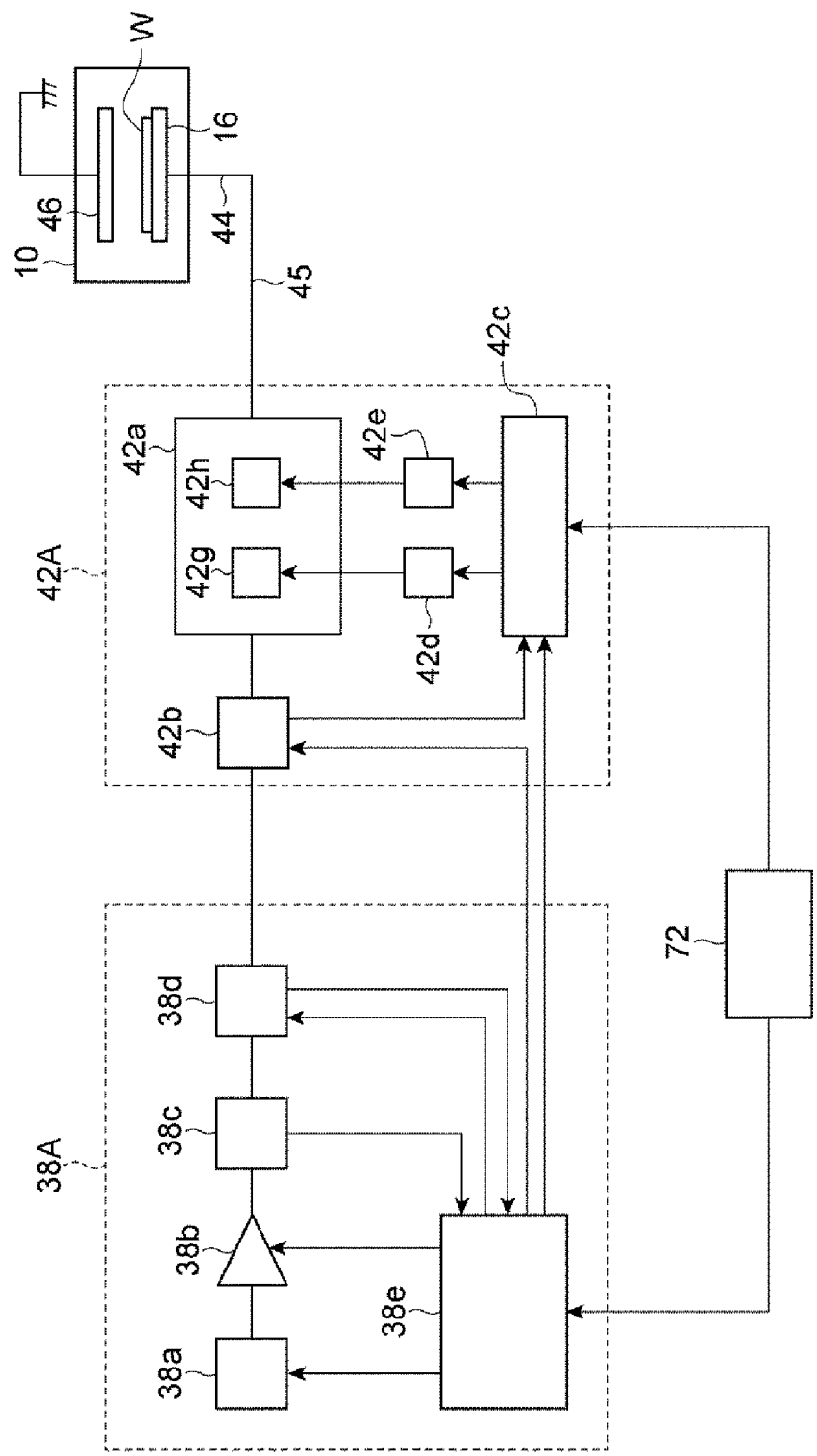
FIG. 14 is a diagram illustrating a configuration of a high frequency power supply 38A and a matching device 42A.
Figure 15:
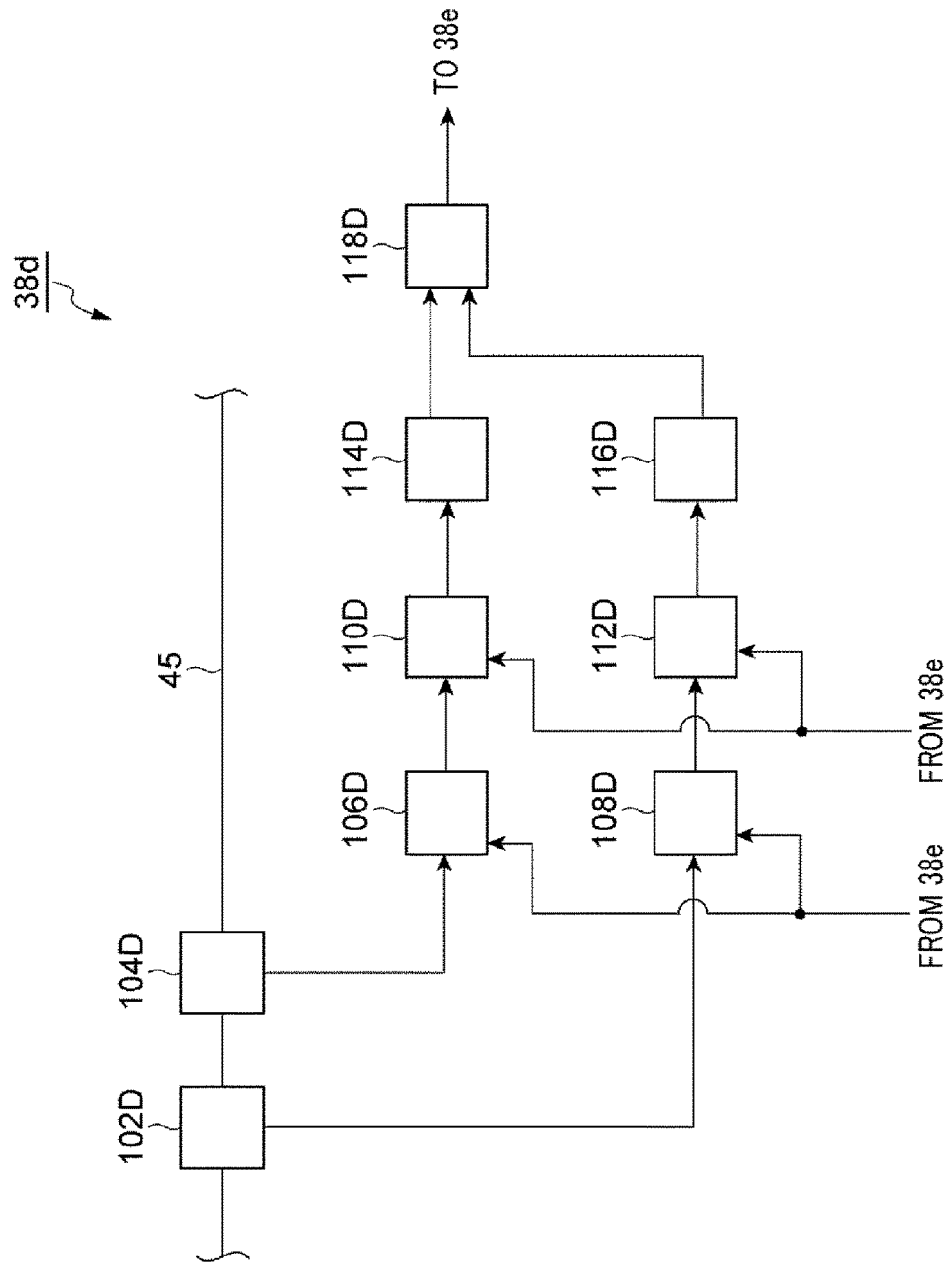
FIG. 15 is a diagram illustrating a configuration of an impedance sensor of the high frequency power supply 38A.

Now, another exemplary embodiment will be explained. In a method MT according to another exemplary embodiment, the frequencies of the high frequency powers RF1 and RF2 are adjusted individually at least in the second stage S2. Further, in still another exemplary embodiment, the powers of the high frequency powers RF1 and RF2 are also adjusted in addition to their frequencies at least in the second stage S2. Below, referring to FIG. 12 to FIG. 15, to perform the method MT according to the present exemplary embodiment, a high frequency power supply 36A, a matching device 40A, a high frequency power supply 38A and a matching device 42A employed in the plasma processing apparatus 1 instead of the high frequency power supply 36, the matching device 40, the high frequency power supply 38 and the matching device 42 will be explained. FIG. 12 is a diagram illustrating a configuration of the high frequency power supply 36A and the matching device 40A. FIG. 13 is a diagram illustrating a configuration of an impedance sensor of the high frequency power supply 36A. FIG. 14 is a diagram illustrating a configuration of the high frequency power supply 38A and the matching device 42A. FIG. 15 is a diagram illustrating a configuration of an impedance sensor of the high frequency power supply 38A.

As depicted in FIG. 12, the high frequency power supply 36A includes, like the high frequency power supply 36, an oscillator 36a, a power amplifier 36b, a power sensor 36c and a power supply controller 36e. The high frequency power supply 36A further includes an impedance sensor 36d. Below, regarding the individual components of the high frequency power supply 36A, distinctive features from the corresponding components of the high frequency power supply 36 will be described. Further, the impedance sensor 36d will also be explained.

The power supply controller 36e of the high frequency power supply 36A is configured to apply, to the oscillator 36a, a frequency control signal for setting the frequency of the high frequency power RF1 in each of a first sub-period Ps1 and a second sub-period Ps2 within the second period P2 during which the second stage S2 is performed. To elaborate, the power supply controller 36e receives, from the impedance sensor 36d, a moving average value Imp11 of the load impedance of the high frequency power supply 36A in the first sub-periods Ps1 of the past cycles CY and a moving average value Imp12 of the load impedance of the high frequency power supply 36A in the second sub-periods Ps2 of the past cycles CY. If the moving average value Imp11 and the moving average value Imp12 are within a preset control range, the power supply controller 36e sends, to the oscillator 36a, the frequency control signal for setting the frequency of the high frequency power RF1 for each of the first sub-period Ps2 and the second sub-period Ps2 in order to allow the load impedance of the high frequency power supply 36A in the first sub-period Ps1 estimated from the moving average value Imp11 and the load impedance of the high frequency power supply 36A in the second sub-period Ps2 estimated from the moving average value Imp12 to approximate to the matching point. The oscillator 36a sets the frequency of the high frequency power for the first sub-period Ps1 and the frequency of the high frequency power for the second sub-period Ps2 according to the corresponding frequency control signal. Meanwhile, if the moving average value Imp11 or the moving average value Imp12 does not fall within the preset control range, the power supply controller 36e sends, to the matching device 40A, a control signal in order to allow the matching device 40A to perform the impedance matching of the high frequency power supply 36A. Here, the allowing of the load impedance to approximate to the matching point ideally implies making the load impedance coincident with the matching point. Further, the "preset control range" refers to a range in which the load impedance of the high frequency power supply 36A can be matched with the matching point or an output impedance of the high frequency power supply 36A through the control of the frequency of the high frequency power RF1.

The power amplifier 36b generates the high frequency power RF1 by amplifying the high frequency power output from the oscillator 36a, and then, outputs the corresponding high frequency power RF1. This power amplifier 36b is controlled by the power supply controller 36e. To be specific, the power supply controller 36e controls the power amplifier 36b to output the high frequency power RF1 having a power level designated by the controller 72.

In the present exemplary embodiment, the power supply controller 36e may control the power amplifier 36b such that the power of the high frequency power RF1 in the first sub-period Ps1 is higher than the power of the high frequency power RF1 in the second sub-period Ps2. By way of example, the power of the high frequency power RF1 in the first sub-period Ps1 may be set, based on the reflection wave power measurement value PR11 in the first sub-period Ps1 or the moving average value of reflection wave power measurement values PR11 in a preset number of first sub-periods Ps1, such that the power of the high frequency power RF1 combined to the plasma reaches a preset power level. Further, the power of the high frequency power RF1 in the second sub-period Ps2 may be set, based on the reflection wave power measurement value PR11 in the second sub-period Ps2 or the moving average value of reflection wave power measurement values PR11 in a preset number of second sub-periods Ps2, such that the power of the high frequency power RF1 combined to the plasma reaches a preset power level.

The impedance sensor 36d calculates the moving average value Imp11 of the load impedance of the high frequency power supply 36A in the first sub-periods Ps1 within the processing times (second periods P2) of the second stages S2 of the completed cycles CY. Further, the impedance sensor 36d also calculates the moving average value Imp12 of the load impedance of the high frequency power supply 36A in the second sub-periods Ps2 within the processing times (second periods P2) of the second stages S2 of the completed cycles CY. As depicted in FIG. 2, within the processing time (second period P2) of each second stage S2, the first sub-period Ps1 is a period ranging from a start time point of the supply of the high frequency power RF2 to a certain time point within the corresponding processing time (second period P2). Further, within the processing time (second period P2) of each second stage S2, the second sub-period Ps2 is a period ranging from the certain time point within the processing time to an end time point of the corresponding processing time (second period P2).

A time length of the first sub-period Ps1 and a time length of the second sub-period Ps2 are set by the power supply controller 36e. By way of example, the time length of the first sub-period Ps1 may be a preset time length stored in the power supply controller 36e, and the time length of the second sub-period Ps2 may be a predetermined time length stored in the power supply controller 36e. Alternatively, based on time series of the aforementioned reflection wave power measurement value PR11, the power supply controller 36e may set, as the second sub-period Ps2, a period in which the reflection wave power measurement value PR11 is stabilized equal to or below a preset value within the second period P2. In such a case, a period prior to this second sub-period Ps2 within the second period P2 may be set as the first sub-period Ps1.

As illustrated in FIG. 13, the impedance sensor 36d includes a current detector 102C, a voltage detector 104C, a filter 106C, a filter 108C, an average value calculator 110C, an average value calculator 112C, a moving average value calculator 114C, a moving average value calculator 116C and an impedance calculator 118C.

The voltage detector 104C is configured to detect a voltage waveform of the high frequency power RF1 transmitted on the power feed line 43 and is configured to output a voltage waveform analog signal indicating the corresponding voltage waveform. This voltage waveform analog signal is input to the filter 106C. The filter 106C is configured to generate a voltage waveform digital signal by digitizing the voltage waveform analog signal input thereto. Further, the filter 106C receives, from the power supply controller 36e, the signal specifying the frequency of the high frequency power RF1 for each of the first sub-period Ps1 and the second sub-period Ps2, and then, generates a filtered voltage waveform signal by extracting, from the voltage waveform digital signal, only the component corresponding to the frequency specified by this signal. Further, the filter 106C may be composed of, by way of non-limiting example, a FPGA (Field Programmable Gate Array).

The filtered voltage waveform signal generated by the filter 106C is output to the average value calculator 110C. The average value calculator 110C receives, from the power supply controller 36e, a sub-period specifying signal specifying the first sub-period Ps1 and the second sub-period Ps2. The average value calculator 110C calculates, from the filtered voltage waveform signal, an average value VA11 of the voltages in the first sub-period Ps1 within each second period P2 specified by using the sub-period specifying signal. Further, the average value calculator 110C also calculates, from the filtered voltage waveform signal, an average value VA12 of the voltages in the second sub-period Ps2 within each second period P2 specified by using the sub-period specifying signal. Furthermore, the average value calculator 110C may be composed of, by way of non-limiting example, a FPGA (Field Programmable Gate Array).

The average value VA11 and the average value VA12 obtained by the average value calculator 110C are output to the moving average value calculator 114C. The moving average value calculator 114C calculates a moving average value (moving average value VMA11) of a preset number of average values VA11 which are obtained for the first sub-periods Ps1 of the second stages S2 of a preset number of recently performed cycles CY among the average values VA11 previously obtained for the second stages S2 of the completed cycles CY. Further, the moving average value calculator 114C also calculates a moving average value (moving average value VMA12) of the preset number of average values VA12 which are obtained for the second sub-periods Ps2 of the second stages S2 of the preset number of recently performed cycles CY among the average values VA12 previously obtained for the second stages S2 of the completed cycles CY. The moving average values VMA11 and VMA12 obtained by the moving average value calculator 114C are output to the impedance calculator 118C. Further, the moving average value calculator 114C may be composed of, by way of non-limiting example, a CPU or a FPGA (Field Programmable Gate Array).

The current detector 102C is configured to detect a current waveform of the high frequency power RF1 transmitted on the power feed line 43 and is configured to output a current waveform analog signal indicating the corresponding current waveform. This current waveform analog signal is input to the filter 108C. Further, the filter 108C is configured to generate a current waveform digital signal by digitizing the current waveform analog signal input thereto. Further, the filter 108C receives, from the power supply controller 36e, the signal specifying the frequency of the high frequency power RF1 for each of the first sub-period Ps1 and the second sub-period Ps2, and then, generates a filtered current waveform signal by extracting, from the current waveform digital signal, only the component corresponding to the frequency specified by this signal. Further, the filter 108C may be composed of, by way of non-limiting example, a FPGA (Field Programmable Gate Array).

The filtered current waveform signal generated by the filter 108C is output to the average value calculator 112C. The average value calculator 112C receives, from the power supply controller 36e, the aforementioned sub-period specifying signal. The average value calculator 112C calculates, from the filtered current waveform signal, an average value IA11 of the electric currents in the first sub-period Ps1 within each second period P2 specified by using the sub-period specifying signal. Further, the average value calculator 112C also calculates, from the filtered current waveform signal, an average value IA12 of the electric currents in the second sub-period Ps2 within each second period P2 specified by using the sub-period specifying signal. Furthermore, the average value calculator 112C may be composed of, by way of non-limiting example, a FPGA (Field Programmable Gate Array).

The average value IA11 and the average value IA12 obtained by the average value calculator 112C are output to the moving average value calculator 116C. The moving average value calculator 116C calculates a moving average value (moving average value IMA11) of a preset number of average values IA11 which are obtained for the first sub-periods Ps1 of the second stages S2 of a preset number of recently performed cycles CY among the average values IA11 previously obtained for the second stages S2 of the completed cycles CY. Further, the moving average value calculator 116C also calculates a moving average value (moving average value IMA12) of the preset number of average values IA12 which are obtained for the second sub-periods Ps2 of the second stages S2 of the preset number of recently performed cycles CY among the average values IA12 previously obtained for the second stages S2 of the completed cycles CY. The moving average values IMA11 and IMA12 obtained by the moving average value calculator 116C are output to the impedance calculator 118C. Further, the moving average value calculator 116C may be composed of, by way of non-limiting example, a CPU or a FPGA (Field Programmable Gate Array).

The impedance calculator 118C calculates the moving average value Imp11 of the load impedance of the high frequency power supply 36A from the moving average value IMA11 and the moving average value VMA11. This moving average value Imp11 includes an absolute value and a phase component. Further, the impedance calculator 118C also calculates the moving average value Imp12 of the load impedance of the high frequency power supply 36A from the moving average value IMA12 and the moving average value VMA12. This moving average value Imp12 includes an absolute value and a phase component. The moving average values Imp11 and Imp12 obtained by the impedance calculator 118C are output to the power supply controller 36e. The moving average values Imp11 and Imp12 are used to set the frequency of the high frequency power RF1 in the power supply controller 36e, as stated above.

Referring back to FIG. 12, the matching device 40A includes, like the matching device 40, a matching circuit 40a, a sensor 40b, a controller 40c and actuators 40d and 40e. Below, regarding the individual components of the matching device 40A, distinctive features from the corresponding components of the matching device 40 will be discussed.

Like the impedance sensor 36d, the sensor 40b of the matching device 40A receives, from the power supply controller 36e, the signal specifying the frequency of the high frequency power RF1 for each of the first sub-period Ps1 and the second sub-period Ps2, and then, generates a filtered voltage waveform signal by extracting, from the voltage waveform digital signal, only the component corresponding to the frequency specified by this signal. Further, the sensor 40b outputs the filtered voltage waveform signal to the controller 40c. Furthermore, like the impedance sensor 36d, the sensor 40b of the matching device 40A receives, from the power supply controller 36e, the signal specifying the frequency of the high frequency power RF1 for each of the first sub-period Ps1 and the second sub-period Ps2, and then, generates a filtered current waveform signal by extracting, from the current waveform digital signal, only the component corresponding to the frequency specified by this signal. The sensor 40b outputs this filtered current waveform signal to the controller 40c.

If the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by an average value of the moving average value Imp11 and the moving average value Imp12 becomes approximate to the matching point. Alternatively, if the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by the moving average value Imp12 approximates to the matching point.

Now, reference is made to FIG. 14. As depicted in FIG. 14, the high frequency power supply 38A includes, like the high frequency power supply 38, an oscillator 38a, a power amplifier 38b, a power sensor 38c and a power supply controller 38e. The high frequency power supply 38A further includes an impedance sensor 38d. Below, regarding the individual components of the high frequency power supply 38A, distinctive features from the corresponding components of the high frequency power supply 38 will be described. Further, the impedance sensor 38d will also be explained.

The power supply controller 38e of the high frequency power supply 38A is configured to apply, to the oscillator 38a, a frequency control signal for setting the frequency of the high frequency power RF2 in each of the first sub-period Ps1 and the second sub-period Ps2. To elaborate, the power supply controller 38e receives, from the impedance sensor 38d, a moving average value Imp21 of the load impedance in the first sub-periods Ps1 of the past cycles CY and a moving average value Imp22 of the load impedance in the second sub-periods Ps2 of the past cycles CY. If the moving average value Imp21 and the moving average value Imp22 are within a preset control range, the power supply controller 38e sends, to the oscillator 38a, the frequency control signal for setting the frequency of the high frequency power RF2 for each of the first sub-period Ps1 and the second sub-period Ps2 in order to allow the load impedance of the high frequency power supply 38A in the first sub-period Ps1 estimated from the moving average value Imp21 and the load impedance of the high frequency power supply 38A in the second sub-period Ps2 estimated from the moving average value Imp22 to approximate to the matching point. The oscillator 38a sets the frequency of the high frequency power for the first sub-period Ps1 and the frequency of the high frequency power for the second sub-period Ps2 according to the corresponding frequency control signal. Meanwhile, if the moving average value Imp21 or the moving average value Imp22 does not fall within the preset control range, the power supply controller 38e sends a control signal to the matching device 42A to allow the matching device 42A to perform the impedance matching of the high frequency power supply 38A. Here, the "preset control range" refers to a range in which the load impedance of the high frequency power supply 38A can be matched with the matching point or an output impedance of the high frequency power supply 38A through the control of the frequency of the high frequency power RF2.

The power amplifier 38b generates the high frequency power RF2 by amplifying the high frequency power output from the oscillator 38a, and then, outputs the corresponding high frequency power RF2. This power amplifier 38b is controlled by the power supply controller 38e. To be specific, the power supply controller 38e controls the power amplifier 38b to output the high frequency power RF2 having a power level designated by the controller 72.

In the present exemplary embodiment, the power supply controller 38e may control the power amplifier 38b such that the power of the high frequency power RF2 in the first sub-period Ps1 is higher than the power of the high frequency power RF2 in the second sub-period Ps2. By way of example, the power of the high frequency power RF2 in the first sub-period Ps1 may be set, based on the reflection wave power measurement value PR21 in the first sub-period Ps1 or the moving average value of reflection wave power measurement values PR21 in the first sub-periods Ps1 of a preset number of cycles CY, such that the power of the high frequency power RF2 combined to the plasma reaches a preset power level. Further, the power of the high frequency power RF2 in the second sub-period Ps2 may be set, based on the reflection wave power measurement value PR21 in the second sub-period Ps2 or the moving average value of reflection wave power measurement values PR21 in the second sub-period Ps2 of the preset number of cycles CY, such that the power of the high frequency power RF2 combined to the plasma reaches a preset power level.

The impedance sensor 38d calculates the moving average value Imp21 of the load impedance of the high frequency power supply 38A in the first sub-periods Ps1 within the processing times (second period P2) of the second stages S2 of the completed cycles CY. Further, the impedance sensor 38d also calculates the moving average value Imp22 of the load impedance of the high frequency power supply 38A in the second sub-periods Ps2 within the processing times (second period P2) of the second stages S2 of the completed cycles CY. Further, like the power supply controller 36e, the power supply controller 38e may store therein a preset time length of the first sub-period Ps1 and a predetermined time length of the second sub-period Ps2. Alternatively, based on the time series of the aforementioned reflection wave power measurement value PR21, like the power supply controller 36e, the power supply controller 38e may set, as the second sub-period Ps2, a period in which the reflection wave power measurement value PR21 is stabilized equal to or below a preset value within the second period P2. In such a case, a period prior to this second sub-period Ps2 within the second period P2 may be set as the first sub-period Ps1.

As illustrated in FIG. 15, the impedance sensor 38d includes a current detector 102D, a voltage detector 104D, a filter 106D, a filter 108D, an average value calculator 110D, an average value calculator 112D, a moving average value calculator 114D, a moving average value calculator 116D and an impedance calculator 118D.

The voltage detector 104D is configured to detect a voltage waveform of the high frequency power RF2 transmitted on the power feed line 45 and is configured to output a voltage waveform analog signal indicating the corresponding voltage waveform. This voltage waveform analog signal is input to the filter 106D. The filter 106D is configured to generate a voltage waveform digital signal by digitizing the voltage waveform analog signal input thereto. Further, the filter 106D receives, from the power supply controller 38e, the signal specifying the frequency of the high frequency power RF2 for each of the first sub-period Ps1 and the second sub-period Ps2, and then, generates a filtered voltage waveform signal by extracting, from the voltage waveform digital signal, only the component corresponding to the frequency specified by this signal. Further, the filter 106D may be composed of, by way of non-limiting example, a FPGA (Field Programmable Gate Array).

The filtered voltage waveform signal generated by the filter 106D is output to the average value calculator 110D. The average value calculator 110D receives, from the power supply controller 38e, a sub-period specifying signal specifying the first sub-period Ps1 and the second sub-period Ps2. The average value calculator 110D calculates, from the filtered voltage waveform signal, an average value VA21 of the voltages in the first sub-period Ps1 within each second period P2 specified by using the sub-period specifying signal. Further, the average value calculator 110D also calculates, from the filtered voltage waveform signal, an average value VA22 of the voltages in the second sub-period Ps2 within each second period P2 specified by using the sub-period specifying signal. Furthermore, the average value calculator 110D may be composed of, by way of non-limiting example, a FPGA (Field Programmable Gate Array).

The average value VA21 and the average value VA22 obtained by the average value calculator 110D are output to the moving average value calculator 114D. The moving average value calculator 114D calculates a moving average value (moving average value VMA21) of a preset number of average values VA21 which are obtained for first sub-periods Ps1 of the second stages S2 of a preset number of recently performed cycles CY among the average values VA21 previously obtained for the second stages S2 of the completed cycles CY. Further, the moving average value calculator 114D also calculates a moving average value (moving average value VMA22) of the preset number of average values VA22 which are obtained for second sub-periods Ps2 of the second stages S2 of a preset number of recently performed cycles CY among the average values VA22 previously obtained for the second stages S2 of the completed cycles CY. The moving average values VMA21 and VMA22 obtained by the moving average value calculator 114D are output to the impedance calculator 118D. Further, the moving average value calculator 114D may be composed of, by way of non-limiting example, a CPU or a FPGA (Field Programmable Gate Array).

The current detector 102D is configured to detect a current waveform of the high frequency power RF2 transmitted on the power feed line 45, and is configured to output a current waveform analog signal indicating the corresponding current waveform. This current waveform analog signal is input to the filter 108D. Further, the filter 108D generates a current waveform digital signal by digitizing the current waveform analog signal input thereto. Further, the filter 108D receives, from the power supply controller 38e, the signal specifying the frequency of the high frequency power RF2 for each of the first sub-period Ps1 and the second sub-period Ps2, and then, generates a filtered current waveform signal by extracting, from the current waveform digital signal, only the component corresponding to the frequency specified by this signal. Further, the filter 108D may be composed of, by way of non-limiting example, a FPGA (Field Programmable Gate Array).

The filtered current waveform signal generated by the filter 108D is output to the average value calculator 112D. The average value calculator 112D receives, from the power supply controller 38e, the aforementioned sub-period specifying signal. The average value calculator 112D calculates, from the filtered current waveform signal, an average value IA21 of the electric currents in the first sub-period Ps1 within each second period P2 specified by using the sub-period specifying signal. Further, the average value calculator 112D also calculates, from the filtered current waveform signal, an average value IA22 of the electric currents in the second sub-period Ps2 within each second period P2 specified by using the sub-period specifying signal. Furthermore, the average value calculator 112D may be composed of, by way of non-limiting example, a FPGA (Field Programmable Gate Array).

The average value IA21 and the average value IA22 obtained by the average value calculator 112D are output to the moving average value calculator 116D. The moving average value calculator 116D calculates a moving average value (moving average value IMA21) of a preset number of average values IA21 which are obtained for the first sub-periods Ps1 of the second stages S2 of the preset number of recently performed cycles CY among the average values IA21 previously obtained for the second stages S2 of the completed cycles CY. Further, the moving average value calculator 116D also calculates a moving average value (moving average value IMA22) of the preset number of average values IA22 which are obtained for the second sub-periods Ps2 of the preset number of recently performed second stages S2 among the average values IA22 previously obtained for the second stages S2 of the completed cycles CY. The moving average values IMA21 and IMA22 obtained by the moving average value calculator 116D are output to the impedance calculator 118D. Further, the moving average value calculator 116D may be composed of, by way of non-limiting example, a CPU or a FPGA (Field Programmable Gate Array).

The impedance calculator 118D calculates the moving average value Imp21 of the load impedance of the high frequency power supply 38A from the moving average value IMA21 and the moving average value VMA21. This moving average value Imp21 includes an absolute value and a phase component. Further, the impedance calculator 118D also calculates the moving average value Imp22 of the load impedance of the high frequency power supply 38A from the moving average value IMA22 and the moving average value VMA22. This moving average value Imp22 includes an absolute value and a phase component. The moving average values Imp21 and Imp22 obtained by the impedance calculator 118D are output to the power supply controller 38e. The moving average values Imp21 and Imp22 are used to set the frequency of the high frequency power RF2 in the power supply controller 38e, as stated above.

Referring back to FIG. 14, the matching device 42A includes, like the matching device 42, a matching circuit 42a, a sensor 42b, a controller 42c and actuators 42d and 42e. Below, regarding the individual components of the matching device 42A, distinctive features from the corresponding components of the matching device 42 will be discussed.

Like the impedance sensor 38d, the sensor 42b of the matching device 42A receives, from the power supply controller 38e, the signal specifying the frequency of the high frequency power RF2 for each of the first sub-period Ps1 and the second sub-period Ps2, and then, generates a filtered voltage waveform signal by extracting, from the voltage waveform digital signal, only the component corresponding to the frequency specified by this signal. Further, the sensor 42b outputs the filtered voltage waveform signal to the controller 42c. Furthermore, like the impedance sensor 38d, the sensor 42b of the matching device 42A receives, from the power supply controller 38e, the signal specifying the frequency of the high frequency power RF2 for each of the first sub-period Ps1 and the second sub-period Ps2, and then, generates a filtered current waveform signal by extracting, from the current waveform digital signal, only the component corresponding to the frequency specified by this signal. The sensor 42b outputs this filtered current waveform signal to the controller 42c.

If the moving average value Imp21 or the moving average value Imp22 does not fall within the preset control range, in response to the aforementioned control signal which is sent from the power supply controller 38e, the controller 42c of the matching device 42A controls the actuators 42d and 42e such that the load impedance of the high frequency power supply 38A specified by an average value of the moving average value Imp21 and the moving average value Imp22 becomes approximate to the matching point. Alternatively, if the moving average value Imp21 or the moving average value Imp22 does not fall within the preset control range, in response to the aforementioned control signal which is sent from the power supply controller 38e, the controller 42c of the matching device 42A controls the actuators 42d and 42e such that the load impedance of the high frequency power supply 38A specified by the moving average value Imp22 approximates to the matching point.

Now, a method of the impedance matching performed in the plasma processing apparatus 1 equipped with the high frequency power supply 36A, the matching device 40A, the high frequency power supply 38A and the matching device 42A described in FIG. 12 to FIG. 15 will be explained. Further, FIG. 16 is a flowchart for describing a method of the impedance matching performed in a plasma processing method according to another exemplary embodiment.

Figure 16:
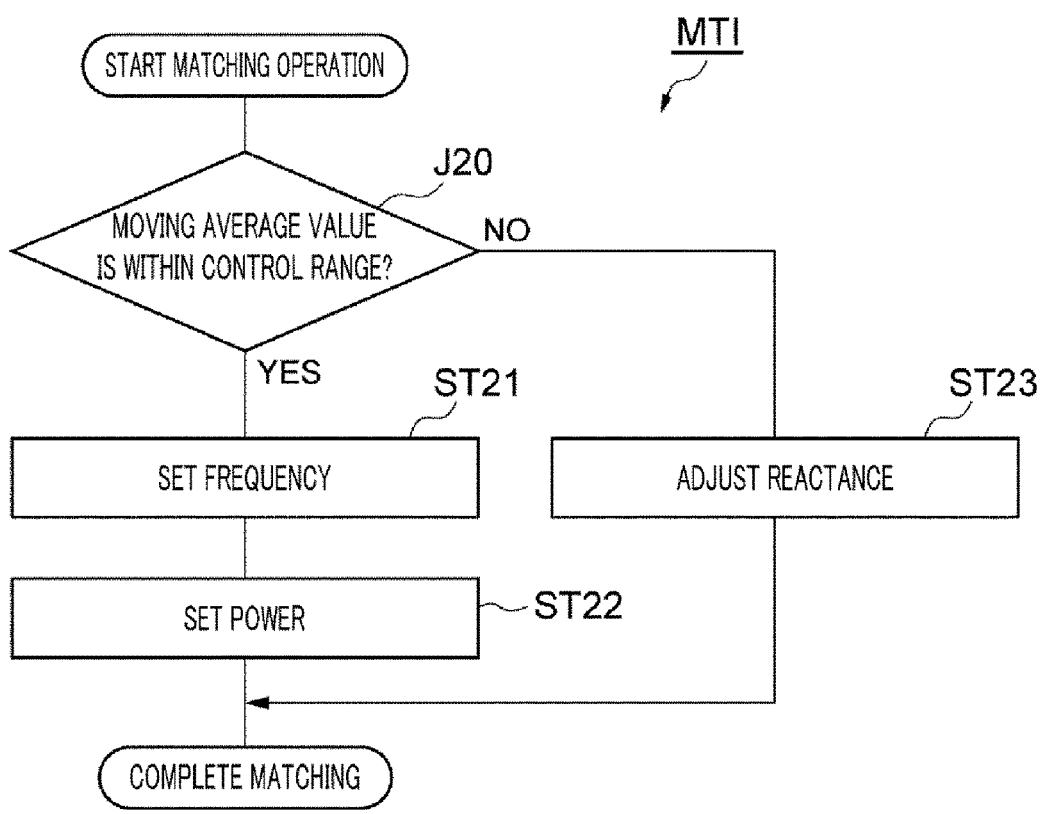
FIG. 16 is a flowchart for describing an impedance matching method performed in a plasma processing method according to another exemplary embodiment.

The method MTI of the impedance matching shown in FIG. 16 is used in the second stage S2 in the method MT. In a stage other than the second stage S2, the above-described impedance matching for the matching device 40 and the matching device 42 may be performed.

In initially performing the method MT, the cycle CY is not performed a sufficient number of times to calculate the moving average value Imp11, the moving average value Imp12, the moving average value Imp21 and the moving average value Imp22. Thus, in initially performing the method MT, only the calculation of the average value VA11, the average value IA11, the average value VA12, the average value IA12, the average value VA21, the average value IA21, the average value VA22 and the average value IA22 and the accumulation thereof are performed.

After the cycle CY is performed a sufficient number of times to calculate the moving average value Imp11, the moving average value Imp12, the moving average value Imp21 and the moving average value Imp22, the moving average value Imp11 and the moving average value Imp12 are obtained in the impedance sensor 36d, and the moving average value Imp21 and the moving average value Imp22 are obtained in the impedance sensor 38d.

After the moving average value Imp11, the moving average value Imp12, the moving average value Imp21 and the moving average value Imp22 are obtained, a determination process J20 is performed in the second stage S2 of each of the cycles CY, as shown in FIG. 16. In the determination process J20, it is determined by the power supply controller 36e whether the moving average value Imp11 and the moving average value Imp12 are within the aforementioned preset control range. Further, it is also determined by the power supply controller 38e whether the moving average value Imp21 and the moving average value Imp22 fall within the aforementioned preset control range.

If it is determined that the moving average value Imp11 and the moving average value Imp12 are found to be within the aforementioned preset control range, the power supply controller 36e sets, in a process ST21, the frequency of the high frequency power RF1 for the first sub-period Ps1 and sets the frequency of the high frequency power RF1 for the second sub-period Ps2, as stated above. In a subsequent process ST22, the power supply controller 36e sets the power of the high frequency power RF1 for the first sub-period Ps1, and sets the power of the high frequency power RF1 for the second sub-period Ps2, as stated above. Further, if it is found out that the moving average value Imp21 and the moving average value Imp22 are within the aforementioned preset control range, the power supply controller 38e sets, in the process ST21, the frequency of the high frequency power RF2 for the first sub-period Ps1, and sets the frequency of the high frequency power RF2 for the second sub-period Ps2, as stated above. Then, in the subsequent process ST22, the power supply controller 38e sets the power of the high frequency power RF2 for the first sub-period Ps1, and sets the power of the high frequency power RF2 for the second sub-period Ps2, as stated above.

Meanwhile, if it is determined that the moving average value Imp11 or the moving average value Imp12 does not fall within the aforementioned preset control range, a control signal is sent from the power supply controller 36e to the matching device 40A in a process ST23 to allow the matching device 40A to perform the impedance matching of the high frequency power supply 36A. In response to this control signal, the controller 40c of the matching device 40A controls the actuators 40d and 40e such that the load impedance of the high frequency power supply 36A approximates to the matching point, as stated above. Further, if it is found out that the moving average value Imp21 or the moving average value Imp22 does not fall within the aforementioned preset control range, a control signal is sent from the power supply controller 38e to the matching device 42A in the process ST23 to allow the matching device 42A to perform the impedance matching of the high frequency power supply 38A. In response to this control signal, the controller 42c of the matching device 42A controls the actuators 42d and 42e such that the load impedance of the high frequency power supply 38A approximates to the matching point, as stated above.

The first sub-period Ps1 in the second stage S2 is a period including the time point when the supply of the high frequency power RF2 is begun. Thus, in the first sub-period Ps1, the reflection wave on the power feed line 43 may be increased than the reflection wave in the second sub-period Ps2, which is caused by the variation of the load impedance of the high frequency power supply 36A. This is the same for the high frequency power RF2. Thus, in order to reduce the reflection wave of the high frequency power RF1, it is required to match the load impedance of the high frequency power supply 36A in each of the first sub-period Ps1 and the second sub-period Ps2 individually with the output impedance of the high frequency power supply 36A. Further, in order to reduce the reflection wave of the high frequency power RF2, it is required to match the load impedance of the high frequency power supply 38A in each of the first sub-period Ps1 and the second sub-period Ps2 individually with the output impedance of the high frequency power supply 38A. According to the method MTI of the impedance matching shown in FIG. 16, the frequency of the high frequency power RF1 is adjusted such that the load impedance of the high frequency power supply 36A estimated from the moving average value (moving average value Imp11) of the load impedance of the high frequency power supply 36A in the first sub-periods Ps1 of the second stages S2 of the completed cycles CY approximates to the output impedance of the high frequency power supply 36A. Further, the frequency of the high frequency power RF1 in the second sub-period Ps2 is adjusted in the same manner based on the moving average value Imp12. Furthermore, the frequency of the high frequency power RF2 in the first sub-period Ps1 is adjusted in the same manner based on the moving average value Imp21. In addition, the frequency of the high frequency power RF2 in the second sub-period Ps2 is adjusted in the same manner based on the moving average value Imp22. According to the method MTI, since the high frequency power supply 36A and the high frequency power supply 38A can change the frequencies of the high frequency powers at a high speed, it is possible to perform the impedance matching while keeping up with the variation of the load impedance at a high speed.

Further, through the process ST22, the power of the high frequency power RF1 can be additionally supplied when the power of the high frequency power RF1 combined to the plasma in the first sub-period Ps1 is not sufficient. Further, through the process ST22, the power of the high frequency power RF2 can also be additionally supplied when the power of the high frequency power RF2 combined to the plasma in the first sub-period Ps1 is not enough.

In the above, various exemplary embodiments have been described. However, the exemplary embodiments are not limiting, and various changes and modifications may be made. By way of example, the high frequency power supply 36 and the high frequency power supply 36A may be configured to supply the high frequency power RF1 to the upper electrode 46. Further, the plasma processing apparatus configured to perform the method MT is not limited to the capacitively coupled plasma processing apparatus. The method MT may also be applicable to any of various plasma processing apparatuses equipped with the first electrode and the second electrode, e.g., an inductively coupled plasma processing apparatus.

In the above-described method MT, each of the multiple cycles CY includes the first stage S1 and the second stage S2. However, each cycle CY may additionally include one or more stages before the first stage S1 or after the second stage S2. By way of example, each cycle CY may include a third stage after the second stage S2. In the third stage, a third processing gas containing the first gas and a third gas added to the first gas may be supplied into the processing vessel 10, and the power level of the high frequency power RF2 in the third stage S3 may be set to be lower than the power level of the high frequency power RF2 in the second stage S2. In this case, as in the aforementioned method of determining the output start time point To, a third delay time corresponding to the flow rates of the first gas and the third gas may be specified from a function or a table. Then, a third time difference between a start time point of the third stage and an output start time point of the third gas prior to the corresponding start time point of the third stage may be initially determined by using the third delay time. This third time difference may be adjusted in the same way as the first time difference. Further, as in the aforementioned method of determining the output stop time point Tt, a fourth delay time corresponding to the flow rate of the first gas may be specified from the function or the table. Then, a fourth time difference between an end time point of the third stage and an output stop time point of the third gas prior to the corresponding end time point of the third stage may be initially determined by using the fourth delay time. This fourth time difference may be adjusted in the same way as the second time difference.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A plasma processing method performed by a plasma processing apparatus,
wherein the plasma processing apparatus comprises:
a processing vessel;
a gas supply system configured to supply a gas into the processing vessel;
a first electrode and a second electrode arranged with a space within the processing vessel therebetween;
a first high frequency power supply configured to output a first high frequency power for plasma generation which is supplied to either one of the first electrode and the second electrode;
a second high frequency power supply configured to supply a second high frequency power for ion attraction which is supplied to the second electrode; and
a controller configured to control the gas supply system, the first high frequency power supply and the second high frequency power supply,
wherein, in the plasma processing method, a plurality of cycles, each of which includes a first stage of generating plasma of a first processing gas containing a first gas within the processing vessel and a second stage of generating plasma of a second processing gas containing the first gas and a second gas added to the first gas within the processing vessel after the first stage, is performed,
the first gas is supplied into the processing vessel and the first high frequency power is supplied to the either one of the first electrode and the second electrode over a first period during which the first stage is performed and a second period during which the second stage is performed after the first period,
the second high frequency power is supplied to the second electrode in the second period,
a power level of the second high frequency power in the first period is set to be lower than a power level of the second high frequency power in the second period, and
wherein the plasma processing method comprises:
starting an output of the second gas from the gas supply system at an output start time point which precedes a start time point of the second period by a first time difference under the control of the controller;
starting a supply of the second high frequency power to the second electrode at the start time point of the second period under the control of the controller;
stopping the output of the second gas from the gas supply system at an output stop time point, within the second period, which precedes an end time point of the second period by a second time difference under the control of the controller; and
reducing the power level of the second high frequency power at the end time point of the second period under the control of the controller,
wherein the controller specifies, by using a function or a table which relates a flow rate of the first gas and a flow rate of the second gas to a delay time from a time point when the gas supply system starts the output of the second gas to a time point when the second gas is supplied into the processing vessel, a first delay time related to the flow rate of the first gas and the flow rate of the second gas in the second stage designated in a recipe, and sets the first delay time as the first time difference initially, and
the controller specifies, by using a function or a table which relates the flow rate of the first gas to a delay time from a time point when the gas supply system stops the output of the second gas to a time point when the supply of the second gas into the processing vessel is ended, a second delay time related to the flow rate of the first gas in the second stage designated in the recipe, and sets the second delay time as the second time difference initially.

2. The plasma processing method of claim 1,
wherein the plasma processing apparatus further comprises:
a first power feed line configured to connect the either one of the first electrode and the second electrode to the first high frequency power supply;
a second power feed line configured to connect the second electrode to the second high frequency power supply;
a first matching device configured to adjust a load impedance of the first high frequency power supply;
a second matching device configured to adjust a load impedance of the second high frequency power supply; and
an operation unit configured to calculate a parameter which includes at least one of the load impedance, a load resistance and a load reactance of the first high frequency power supply and a reflection wave coefficient of the first high frequency power,
wherein if the parameter exceeding a first threshold value is obtained by the operation unit during a time period between the output start time point immediately before the second period within a processing time of a preset cycle among the cycles and the start time point of the second period within the processing time of the preset cycle, the controller decreases the first time difference by a time difference between a time point when the parameter exceeding the first threshold value is obtained and the start time point of the second period within the processing time of the preset cycle.

3. The plasma processing method of claim 2,
wherein if the parameter exceeding the first threshold value is not obtained by the operation unit during the time period between the output start time point immediately before the second period within the processing time of the preset cycle among the cycles and the start time point of the second period within the processing time of the preset cycle, the controller increases the first time difference by a preset time length.

4. The plasma processing method of claim 2,
wherein if the parameter exceeding a second threshold value is obtained by the operation unit during a time period between the output stop time point of the second period within a processing time of a preset cycle among the cycles and the end time point of the second period within the processing time of the preset cycle, the controller decreases the second time difference by a time difference between a time point when the parameter exceeding the second threshold value is obtained and the end time point of the second period within the processing time of the preset cycle.

5. The plasma processing method of claim 4, wherein if the parameter exceeding the second threshold value is not obtained by the operation unit during the time period between the output stop time point of the second period within the processing time of the preset cycle among the cycles and the end time point of the second period within the processing time of the preset cycle, the controller increases the second time difference by a preset time length.

* * * * *